United States Patent
Bae et al.

(10) Patent No.: US 10,062,427 B2
(45) Date of Patent: Aug. 28, 2018

(54) SEMICONDUCTOR MEMORY DEVICE FOR CONTROLLING HAVING DIFFERENT REFRESH OPERATION PERIODS FOR DIFFERENT SETS OF MEMORY CELLS

(71) Applicant: Samsung Electronics Co., Ltd., Suwon-si (KR)

(72) Inventors: Whi-Young Bae, Gwangju-si (KR); Young-Sik Kim, Gunpo-si (KR); Young-Yong Byun, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 82 days.

(21) Appl. No.: 14/722,634

(22) Filed: May 27, 2015

(65) Prior Publication Data
US 2016/0005452 A1 Jan. 7, 2016

(30) Foreign Application Priority Data
Jul. 2, 2014 (KR) .................. 10-2014-0082530

(51) Int. Cl.
*G06F 11/10* (2006.01)
*G11C 11/406* (2006.01)
(Continued)

(52) U.S. Cl.
CPC ........ *G11C 11/406* (2013.01); *G06F 11/1048* (2013.01); *G11C 11/40611* (2013.01);
(Continued)

(58) Field of Classification Search
CPC ..... G11C 11/406; G11C 29/783; G11C 29/24; G11C 11/401; G11C 11/40611; G11C 11/40618
(Continued)

(56) References Cited

U.S. PATENT DOCUMENTS 6,166,980 A 12/2000 Chun
6,731,560 B2 * 5/2004 Yoon; Seok Cheol ..................... G11C 11/406
365/200
(Continued)

FOREIGN PATENT DOCUMENTS

KR 10-2001-0059018 A 7/2001
KR 10-2003-0055747 A 7/2003
(Continued)

*Primary Examiner* — James C Kerveros
(74) *Attorney, Agent, or Firm* — Muir Patent Law, PLLC

(57) ABSTRACT

Provided is a semiconductor memory device for controlling a refresh operation of redundancy memory cells. The semiconductor memory device may include normal memory cells and redundancy memory cells that are used to repair normal memory cell(s) to which a defective cell is connected, and an error-correction code (ECC) memory cell row that stores parity bits for controlling the defective cell. Memory cells on the normal memory cell rows are refreshed during a first refresh cycle. Other memory cells on, such as redundancy memory cell rows, an edge memory cell row that is adjacent to the redundancy memory cell row(s) from among the normal memory cell rows, and/or the ECC memory cell row may be refreshed during a second refresh cycle that is different from the first refresh cycle.

19 Claims, 23 Drawing Sheets

(51) Int. Cl.
*G11C 11/408* (2006.01)
*G11C 29/00* (2006.01)
*G11C 29/04* (2006.01)
*G11C 29/24* (2006.01)

(52) U.S. Cl.
CPC .............. *G11C 29/24* (2013.01); *G11C 29/70* (2013.01); *G11C 29/783* (2013.01); *G11C 29/816* (2013.01); *G11C 11/408* (2013.01); *G11C 2029/0411* (2013.01); *G11C 2211/4061* (2013.01)

(58) Field of Classification Search
USPC .......................................... 365/222; 714/764
See application file for complete search history.

(56) References Cited

U.S. PATENT DOCUMENTS

| | | | |
|---|---|---|---|
| 6,898,142 B2 | 5/2005 | Takahashi | |
| 7,388,799 B2* | 6/2008 | An | G11C 11/406 365/185.09 |
| 8,072,827 B2* | 12/2011 | Wakimoto | G11C 11/406 365/200 |
| 8,184,493 B2* | 5/2012 | Kobayashi | G11C 11/406 365/200 |
| 8,873,324 B2 | 10/2014 | Park et al. | |
| 9,455,016 B2* | 9/2016 | Yang | G11C 11/406 |
| 2005/0052928 A1* | 3/2005 | Koshikawa | G11C 11/406 365/222 |
| 2007/0147154 A1* | 6/2007 | Lee | G11C 11/406 365/222 |
| 2009/0161457 A1* | 6/2009 | Wakimoto | G11C 11/406 365/200 |
| 2015/0063049 A1* | 3/2015 | Yang | G11C 11/406 365/222 |
| 2016/0064062 A1* | 3/2016 | Park | G11C 29/783 365/222 |

FOREIGN PATENT DOCUMENTS

| | | |
|---|---|---|
| KR | 10-2005-0095980 A | 10/2005 |
| KR | 10-2006-0038808 A | 5/2006 |
| KR | 10-2007-0002819 A | 1/2007 |
| KR | 10-0833592 B1 | 5/2008 |

* cited by examiner

SEMICONDUCTOR MEMORY DEVICE FOR CONTROLLING HAVING DIFFERENT REFRESH OPERATION PERIODS FOR DIFFERENT SETS OF MEMORY CELLS

CROSS-REFERENCE TO RELATED APPLICATION

This application claims the benefit of Korean Patent Application No. 10-2014-0082530, filed on Jul. 2, 2014, in the Korean Intellectual Property Office, the disclosure of which is incorporated herein in its entirety by reference.

BACKGROUND

The present disclosure relates to a semiconductor memory device, and more particularly, to a semiconductor memory device for controlling a refresh operation of redundancy memory cells.

A dynamic random-access memory (DRAM) is typically used as a main memory of a data processing apparatus such as a computer. In the DRAM, when a normal memory cell in a normal memory cell array is determined to be defective, the normal memory cell may be replaced by a redundancy memory cell in a redundancy memory cell array. When the redundancy memory cells are frequently accessed, adjacent other redundancy memory cells may be easily disturbed. Accordingly, data retention characteristics of the redundancy memory cells may be degraded.

SUMMARY

The inventive concept provides a semiconductor memory device for controlling a refresh operation of redundancy memory cells according to data retention characteristics of the redundancy memory cells.

The inventive concept also provides a method of refreshing a semiconductor memory device to prevent redundancy memory cells from being disturbed.

According to an aspect of the inventive concept, there is provided a semiconductor memory device including: a memory cell array including a plurality of memory cells arranged in rows and columns, wherein the rows are divided into a first set of rows and a second set of rows, and wherein one or more rows of the first set of rows are configured to be replaced with one or more rows of the second set of rows, and a refresh address generator configured to generate first and second refresh addresses such that memory cells of the first set of rows are refreshed during a first refresh cycle in response to the first refresh address and memory cells of the second set of rows are refreshed during a second refresh cycle in response to the second refresh address. A period of time of the second refresh cycle is different from a period of time of the first refresh cycle. The refresh address generator is configured to generate the first refresh address by a first counting operation and the second refresh address by a second counting operation.

According to another aspect of the inventive concept, there is provided a semiconductor memory device including: a first memory cell block including a first set of memory cells arranged in a first set of rows and a first set of columns, a second memory cell block including a second set of memory cells arranged in a second set of rows and a second set of columns, wherein the second set of memory cells may be configured to store parity bits such that a defective memory cell of the first set of rows may be repaired by the parity bits; and a refresh address generator configured to generate a refresh address such that the first set of memory cells are refreshed during a first refresh cycle and the second set of memory cells are refreshed during a second refresh cycle. A period of time of the second refresh cycle may be different from a period of time of the first refresh cycle.

According to another aspect of the inventive concept, there is provided a semiconductor memory device including: a first memory cell block including a first set of memory cells arranged in a first set of rows, a second memory cell block including a second set of memory cells arranged in a second set of rows, wherein one or more rows of the first set of rows including a first defective memory cell are configured to be replaced with one or more rows of the second set of rows, and a third memory cell block including a third set of memory cells arranged in a third set of rows, wherein the third set of memory cells are configured to store parity bits such that a defective memory cell of the first set of rows is repaired by the parity bits. The semiconductor memory device is configured that the first set of memory cells are refreshed during a first refresh cycle, the second set of memory cells are refreshed during a second refresh cycle, and the third set of memory cells are refreshed during a third refresh cycle. A period of time of each of the second and third refresh cycles is different from a period of time of the first refresh cycle.

BRIEF DESCRIPTION OF THE DRAWINGS

Exemplary embodiments of the present disclosure will be more clearly understood from the following detailed description taken in conjunction with the accompanying drawings in which.

DETAILED DESCRIPTION OF THE EMBODIMENTS

Figure 1:
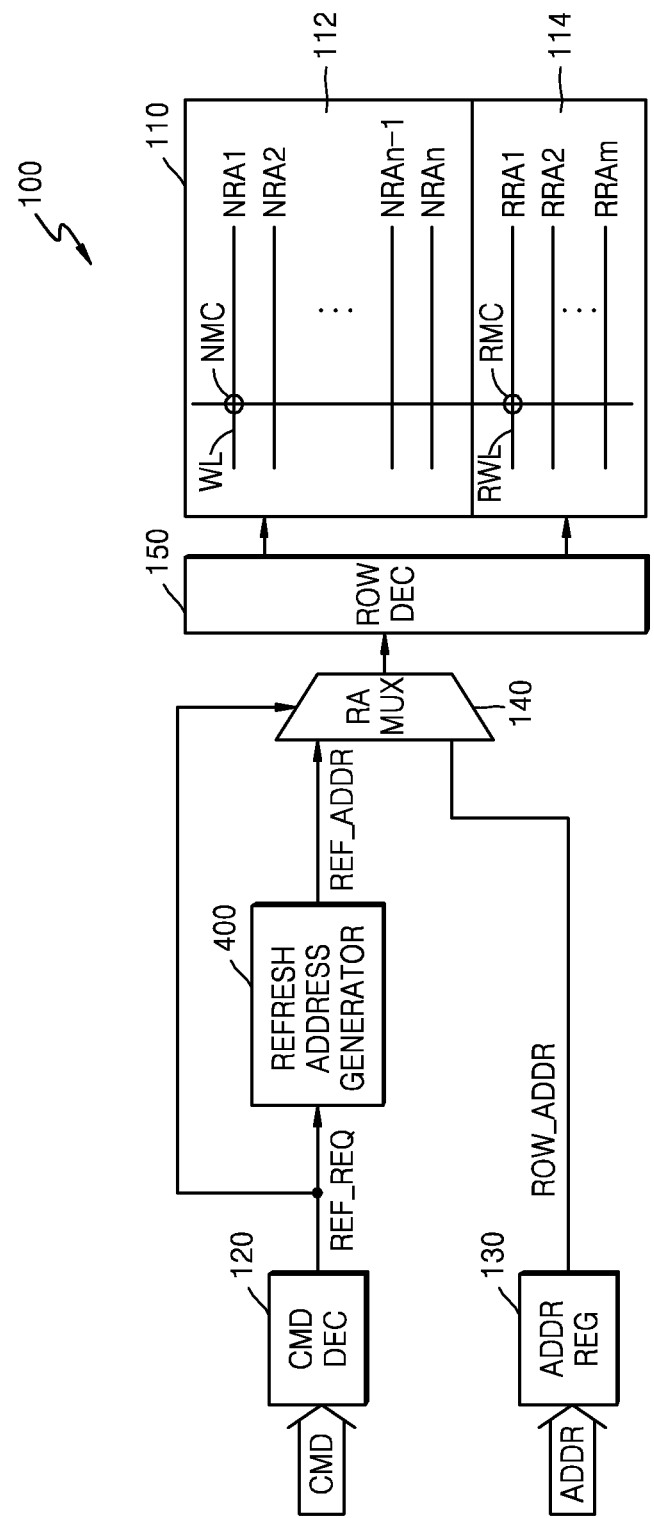
FIG. 1 is a diagram for explaining a semiconductor memory device for controlling a refresh operation according to an example embodiment of the inventive concept.

As used herein, the term "and/or" includes any and all combinations of one or more of the associated listed items. Expressions such as "at least one of," when preceding a list of elements, modify the entire list of elements and do not modify the individual elements of the list.

The advantages and features of the inventive concept and methods of achieving the advantages and features will be described more fully with reference to the accompanying drawings, in which exemplary embodiments of the inventive concept are shown.

The inventive concept will now be described more fully with reference to the accompanying drawings, in which exemplary embodiments of the inventive concept are shown. Although exemplary embodiments have been described, one of ordinary skill in the art will readily appreciate that many modifications are possible in exemplary embodiments without materially departing from the novel teachings and advantages of exemplary embodiments. That is, specific structural and functional details disclosed herein are merely representative for purposes of describing exemplary embodiments. This inventive concept, however, may be embodied in many alternate forms and should not be construed as limited to only the exemplary embodiments set forth herein. Accordingly, all changes, equivalents, and alternatives are intended to be included within the scope of the claims. Similar reference numerals denote similar elements in the description of the drawings. In the appended drawings, sizes of structures are exaggerated for clarity of the inventive concept.

The terminology used herein is for the purpose of describing exemplary embodiments only and is not intended to be limiting of exemplary embodiments. As used herein, the singular forms "a", "an" and "the" are intended to include the plural forms as well, unless the context clearly indicates otherwise. It will be further understood that the terms "comprises," "comprising," "includes," and/or "including," used herein specify the presence of stated features, integers, steps, operations, members, components, and/or groups thereof, but do not preclude the presence or addition of one or more other features, integers, steps, operations, members, components, and/or groups thereof.

It will be understood that when an element is referred to as being "connected" or "coupled" to another element, it can be directly connected or coupled to the other element or intervening elements may be present. In contrast, when an element is referred to as being "directly connected" or "directly coupled" to another element, or as contacting another element, there are no intervening elements present.

It will be understood that, although the terms first, second, etc. may be used herein to describe various elements, these elements should not be limited by these terms unless the context indicates otherwise. Unless indicated otherwise, these terms are only used to distinguish one element from another. For example, a first signal could be termed a second signal, and, similarly, a second signal could be termed a first signal without departing from the teachings of the disclosure.

All terms including technical and scientific terms used herein have meanings which can be generally understood by those of ordinary skill in the art, if the terms are not particularly defined. General terms defined by dictionaries should be understood to have meanings which can be contextually understood in the art and should not have ideally or excessively formal meanings, if the terms are not defined particularly herein by the inventive concept.

FIG. 1 is a diagram for explaining a semiconductor memory device 100 for controlling a refresh operation according to an example embodiment of the inventive concept.

Referring to FIG. 1, the semiconductor memory device 100 includes a memory cell array 110, a command decoder 120, an address register 130, a row address multiplexer 140, a row decoder 150, and a refresh address generator 400.

As used herein, a semiconductor memory device may refer to various items such as a memory device, one or more logic devices or memory cells formed in or on a semiconductor substrate, a semiconductor chip, a memory chip, a logic chip, a package, or combinations thereof. A semiconductor memory device such as a semiconductor chip, a memory chip, or a logic chip may be formed from a wafer. A semiconductor memory device may comprise a package which may include one or more chips stacked on a package substrate, or a package-on-package device including a plurality of packages. A semiconductor memory device may include an array of memory cells.

An electronic device, as used herein, may refer to one of these devices and may also include products that include these devices, such as a memory module, a hard drive including additional components, a mobile phone, laptop, tablet, desktop, camera, server, computing system, or other consumer electronic device, etc.

The memory cell array 110 includes a normal memory cell array 112 and a redundancy memory cell array 114. The normal memory cell array 112 includes a plurality of normal memory cells NMCs that are arranged in rows and columns. The redundancy memory cell array 114 includes a plurality of redundancy memory cells RMCs that are arranged in rows and columns.

A plurality of word lines WLs in a row direction and a plurality of bit lines BLs in a column direction perpendicularly cross each other to form a matrix. One memory cell is located at each intersection of the matrix. Word lines that are connected to the normal memory cells NMCs are referred to as normal word lines WLs and word lines that are connected to the redundancy memory cells RMCs are referred to as redundancy word lines RWL.

Figure 2A:
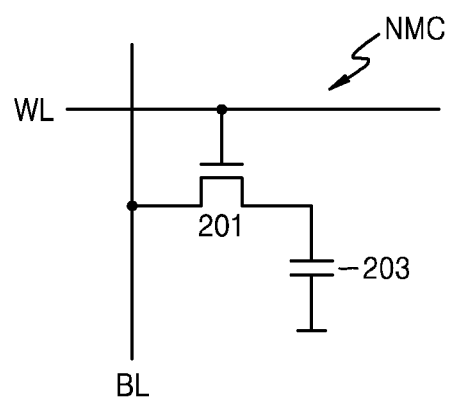
FIGS. 2A and 2B are diagrams for explaining a normal memory cell and a redundancy memory cell that are included in the semiconductor memory device of FIG. 1, according to an example embodiment of the inventive concept.
Figure 2B:
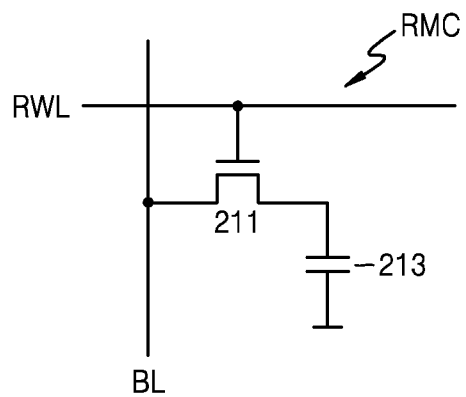

Each of the normal memory cells NMCs includes one access transistor 201 and one storage capacitor 203 as shown in FIG. 2A. A gate of the access transistor 201 is connected to the normal word line WL, and a drain or a source of the access transistor 201 is connected to the bit line BL. Each of the redundancy memory cells RMCs includes one access transistor 211 and one storage capacitor 213 as shown in FIG. 2B. A gate of the access transistor 211 is connected to the redundancy word line RWL, and a drain or a source of the access transistor 211 is connected to the bit line BL.

The command decoder 120 may decode a command CMD that is received from a memory controller (not shown). The command decoder 120 may generate control signals corresponding to the command CMD by decoding a write enable signal /WE, a row address strobe signal /RAS, a column address strobe signal /CAS, and a chip selection signal /CS. The command decoder 120 may generate a refresh request signal REF_REQ in response to a refresh command REF_CMD so that the refresh address generator 400 generates a refresh row address REF_ADDR.

The address register 130 may receive an address ADDR including a row address ROW-ADDR and a column address from the memory controller. The address register 130 may apply the received row address ROW_ADDR to the row address multiplexer 140, and may apply the received column address to a column decoder. The column decoder may activate a sense amplifier corresponding to the column address. Data that is read from the memory cell array 110 may be sensed and amplified by the sense amplifier and may be applied to the memory controller through a data input/output buffer.

The row address multiplexer 140 may receive the row address ROW_ADDR from the address register 130 and may receive the refresh row address REF_ADDR from the refresh address generator 400. The row address multiplexer 140 may selectively output the row address ROW_ADDR or the refresh row address REF_ADDR in response to the refresh request signal REF_REQ. The row address that is output from the row address multiplexer 440 may be applied to the row decoder 150.

The row decoder 150 may activate the normal word line WL corresponding to the row address by decoding the row address that is output from the row address multiplexer 140. The normal word lines WLs of the normal memory cell array 112 are addressed by a normal row address NRA, and the redundancy word lines RWLs of the redundancy memory cell array 114 are addressed by a redundancy row address RRA. For convenience, the following will be explained on the assumption that in the normal memory cell array 112, n (n is a natural number equal to or greater than 1) normal word lines WLs are addressed by the row address corresponding to normal memory cell rows NRA1 through NRAn, and in the redundancy memory cell array 114, m (m is a natural number equal to or greater than 1, m<n) redundancy word lines RWLs are addressed by the row address corresponding to redundancy memory cell rows RRA1 through RRAm.

In the normal memory cell array 112, when one normal memory cell NMC has been determined to be defective (e.g., defective cell), the failed normal memory cell is replaced with one redundancy memory cell RMC. In example embodiments, repair methods may be selectively or collectively used in units of cells, word lines, bit lines, or blocks according to redundancy repair methods. For example, a normal word line WL that includes a defective normal memory cell NMC may be replaced in its entirety with a redundancy word line RWL (so that all memory cells of the normal word line WL are replaced with a corresponding redundant memory cell of the redundancy word line RWL). In some examples, defective normal memory cells NMC may be replaced by replacing corresponding normal bit lines with redundant bit lines. In some example, only portions of a normal word line WL (or normal bit line) may be replaced by a corresponding portion of a redundant word line RWL (or a corresponding portion of a redundant bit line).

Failed normal memory cells may be randomly replaced with the redundancy memory cells RMCs. In general, a physical location of the normal memory cell NMC that is to be accessed may correspond to the address ADDR that is applied from an external source (e.g., a memory controller or host requesting access to the memory device 100). Thus, analyses of accesses in view of the physical location of the accesses may be performed (e.g., by an external memory controller) based on the address ADDR when the normal memory cell has not been determined to be defective. However, when a normal memory cell NMC has been judged as defective and is replaced with a redundancy memory cell RMC, the physical location of the accessed memory cell does not correspond to the address ADDR, as the physical location corresponds to a location of the replacing redundancy memory cell RMC. Thus, analyses of accesses in view of the physical location of the accesses may not be based on the address ADDR when the address ADDR corresponds to a replacing redundancy memory cell RMC.

In some cases, a specific redundancy memory cell row may be frequently accessed. In this case, redundancy memory cells arranged adjacent to the specific redundancy memory cell row may be disturbed, thereby degrading data retention characteristics. A data retention time of the redundancy memory cells arranged adjacent to the specific redundancy memory cell row may be shorter than a data retention time of the normal memory cells NMCs.

Figure 3:
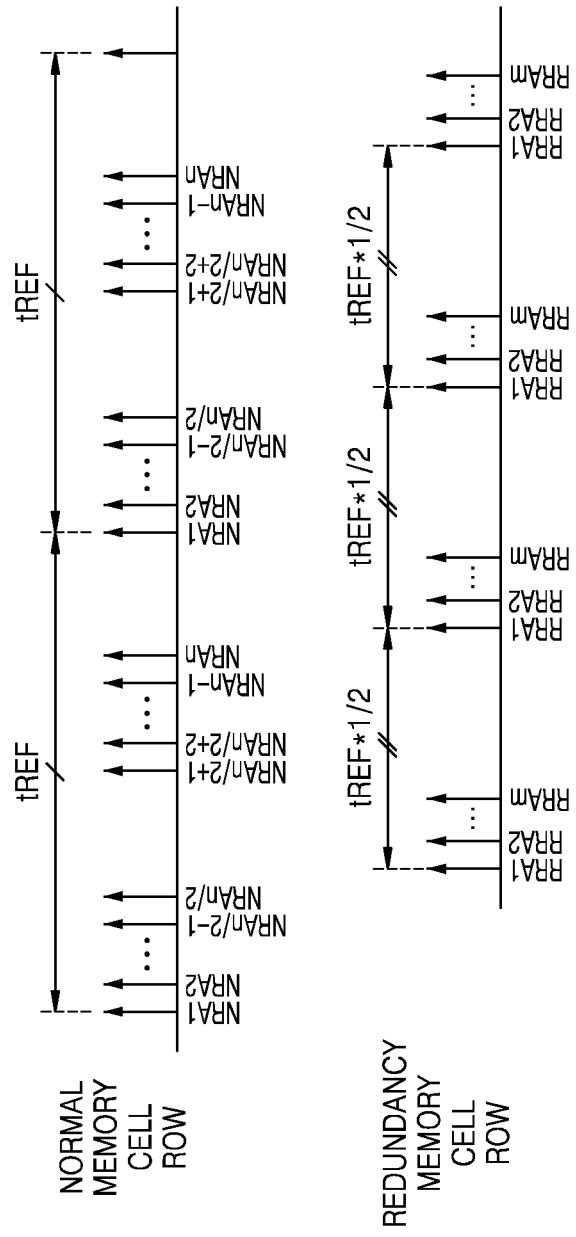
FIG. 3 is a timing diagram for explaining of refreshing memory cells of memory cell rows performed according to a refresh operation of the semiconductor memory device of FIG. 1, according to an exemplary embodiment of the inventive concept.

FIG. 3 is a timing diagram for explaining of refreshing memory cells of memory cell rows performed according to a refresh operation of the semiconductor memory device of FIG. 1, according to an exemplary embodiment.

Referring to FIG. 3, the semiconductor memory device 100 performs a refresh operation in order to maintain data that is stored in a memory cell. The memory cell of the semiconductor memory device 100 is set to be refreshed during a refresh cycle tREF that may be defined in a specification (i.e., tREF may have a predetermined value). The refresh address generator 400 may generate the refresh row address REF_ADDR such that the normal memory cells NMCs that are connected to the normal memory cell rows NRA1 through NRAn (e.g., normal word lines WLs) are refreshed during the refresh cycle tREF and the redundancy memory cells RMCs that are connected to redundancy memory cell rows RRA1 through RRAm (e.g., redundancy word lines RWLs) are refreshed for a cycle that is different from the refresh cycle tREF.

In an embodiment, the refresh address generator 400 may generate the refresh row address REF_ADDR such that normal memory cells of the normal memory cell rows NRA1 through NRAn are refreshed during the refresh cycle tREF and redundancy memory cells of the redundancy memory cell rows RRA1 through RRAm are refreshed for a cycle corresponding to a half of the refresh cycle tREF. In example embodiments, during the refresh cycle tREF, normal memory cells of the normal memory cell rows NRA1 through NRAn/2 that correspond to a half of the normal memory cell rows NRA1 through NRAn may be sequentially refreshed, redundancy memory cells of the redundancy memory cell rows RRA1 through RRAm may be sequentially refreshed, normal memory cells of the normal memory cell rows NRAn/2+1 through NRAn that correspond to normal memory cells of the remaining half of the normal memory cell rows NRA1 through NRAn may be sequentially refreshed, and redundancy memory cells of the redundancy memory cell rows RRA1 through RRAm may be sequentially refreshed. Accordingly, the normal memory cells NMCs connected to the normal memory cell rows NRA1 through NRAn are each refreshed once during the refresh cycle tREF and the redundancy memory cells RMCs connected to the redundancy memory cell rows RRA1 through RRAm are each refreshed once during a half of the refresh cycle tREF. As discussed below, exceptions may be made for this refresh scheduling so that certain normal memory cell rows determined to have "weak cells" may be selected for additional refresh operations during each refresh cycle tREF. In addition, certain redundant memory cells determined to have "weak cells" may be selected for additional refresh operation during each half of the refresh cycle (e.g., so that such they are refreshed three or more times per refresh cycle tREF, such as twice per each half of the refresh cycle tREF. Similarly, exceptions may also be made for this refresh scheduling so that rows (either normal memory cell rows or redundant memory cell rows) consisting of "strong cell" may be refreshed less than this default refresh scheduling.

Figure 4:
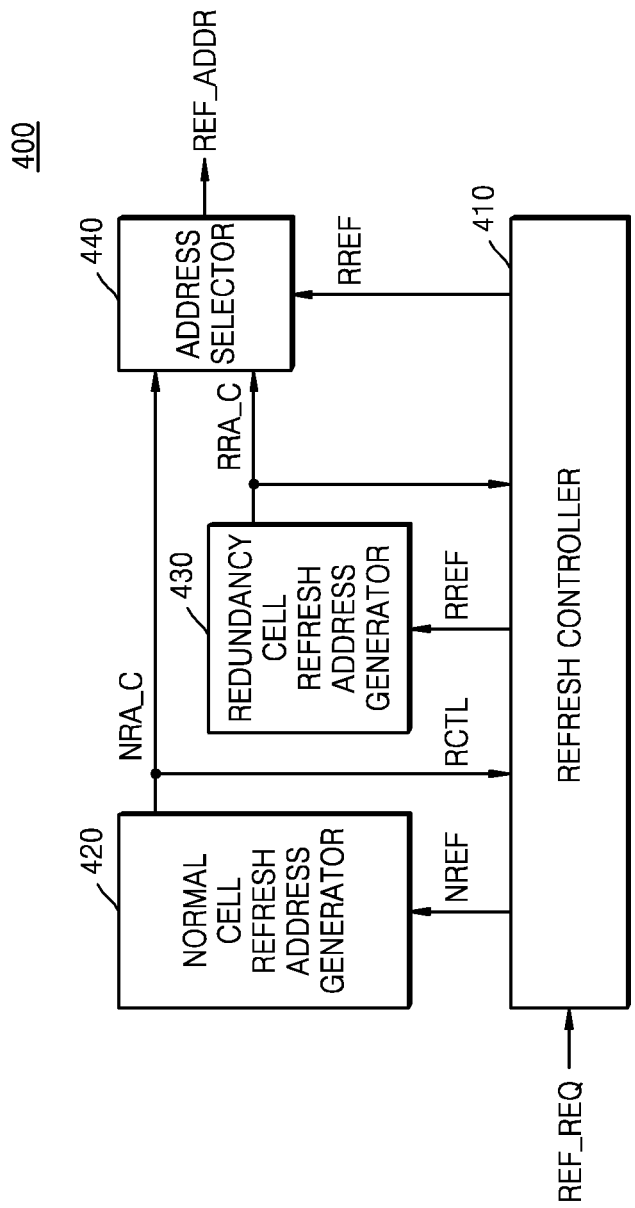
FIG. 4 is a block diagram illustrating a refresh address generator that is included in the semiconductor memory device of FIG. 1, according to an exemplary embodiment of the inventive concept.

FIG. 4 is a block diagram for explaining the refresh address generator 400 that is included in the semiconductor memory device 100 of FIG. 1, according to an example embodiment of the inventive concept.

Referring to FIG. 4, the refresh address generator 400 may include a refresh controller 410, a normal cell address generator 420, a redundancy cell address generator 430, and an address selector 440. The normal cell address generator 420 and the redundancy cell address generator 430 may sequentially output row addresses for the normal memory cell rows NRA1 through NRAn and the redundancy memory cell rows RRA1 through RRAm by using a corresponding counter. The counter of the normal cell address generator 420 may output a sequence of count values so that all row addresses for the normal memory cells rows NRA1 through NRAn are generated during each refresh cycle tREF (e.g., each count value representing a row address of a corresponding one of the normal memory cell rows NRA1 through NRAn). The counter of the redundancy cell address generator 430 may output a sequence of count values so that all row addresses for the redundancy memory cells rows RRA1 through RRAm are generated during each half (or other fraction) of a refresh cycle tREF (e.g., each count value representing a row address of a corresponding one of the redundancy memory cell rows RRA1 through RRAm). Starting and ending addresses of the counters of the normal cell refresh address generator 420 (e.g., NRA1, NRAn) and the redundancy cell refresh address generator 430 (e.g., RRA1, RRAm) may correspond to the size of the corresponding memory cell array (e.g., the size of normal memory cell array 112 and size of redundant memory cell array 114) such that the counter provides a row address for each of the corresponding memory cell array during each count cycle, or may correspond to a portion of the size of the corresponding memory cell array (e.g., for the normal memory cell array 112, may correspond to only sections of the normal memory cell array 112 that are currently storing data so that other sections need not be refreshed, and for the redundant memory cell array 114, may correspond to only sections of the redundant memory cell array 114 that were used to replace defective normal word lines.) In such a case, the staring and ending addresses for the appropriate counter may be set, such as dynamically set by a memory controller or by accessing a programmed register.

The refresh controller 410 may generate a first refresh signal NREF, a second refresh signal RREF, and a selection signal SEL in response to the refresh request signal REF_REQ and a refresh cycle control signal RCTL. The refresh cycle control signal RCTL may correspond to at least one bit of a counting signal that is output from the normal cell address generator 420. According to embodiments, the refresh request signal REF_REQ may be generated in response to a refresh command that is periodically applied from a host device, for example, the memory controller, or may be generated by using a built-in timer that is included in the semiconductor memory device 100.

The normal cell address generator 420 may generate a counting signal by performing a counting operation in response to the first refresh signal NREF. The normal cell address generator 420 may output at least one bit of the counting signal as the refresh cycle control signal RCTL. For example, the normal cell address generator 420 may generate a counting signal including N+1 bits (N is a natural number equal to or greater than 1), may output the counting signal including the N+1 bits as a normal cell refresh address NRA_C, and may output three upper bits of the counting signal as the refresh cycle control signal RCTL.

The redundancy cell address generator 430 may generate a counting signal by performing a counting operation in response to the second refresh signal RREF. For example, the redundancy cell address generator 430 may generate a counting signal including M+1 bits (M is a natural number equal to or greater than 1, M<N), and may output the counting signal including the M+1 bits as a redundancy cell refresh address RRA_C.

The address selector 440 may selectively output the normal cell refresh address NRA_C that is applied from the normal cell address generator 420 or the redundancy cell refresh address RRA_C that is applied from the redundancy cell address generator 430 in response to the selection signal SEL. According to embodiments, the address selector 440 may include a multiplexer that selectively outputs the normal cell refresh address NRA_C or the redundancy cell refresh address RRA_C in response to the selection signal SEL.

In an embodiment, the first refresh signal NREF may be generated according to the refresh request signal REF_REQ.

The second refresh signal RREF may be generated according to the refresh request signal REF_REQ in response to a most significant bit (MSB) of the redundancy cell refresh address RRA_C and the refresh cycle control signal RCTL. The first refresh signal NREF and the second refresh signal RREF may be complementarily generated. The selection signal SEL may be generated to have a logic high level during a period for which the second refresh signal RREF is generated.

Figure 5:
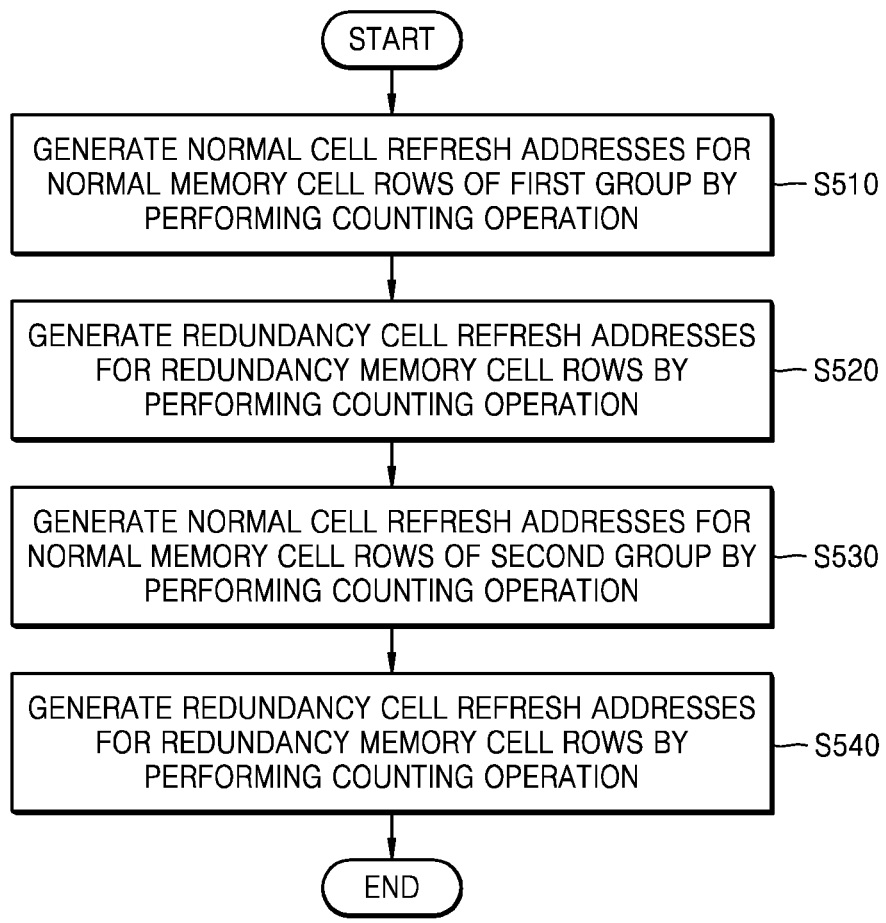
FIG. 5 is a flowchart for explaining a refresh method of the semiconductor memory device of FIG. 1, according to an exemplary embodiment of the inventive concept.

FIG. 5 is a flowchart for explaining a refresh operation of the semiconductor memory device 100 of FIG. 1, according to an embodiment of the inventive concept.

Referring to FIG. 5 in association with FIG. 4, the refresh controller 410 may generate, in response to the refresh request signal REF_REQ, the first refresh signal NREF that enables a counting operation of the normal cell address generator 420. In operation S510, the normal cell address generator 420 may output a counting signal by performing a counting operation in response to the first refresh signal NREF and may output the counting signal as the normal cell refresh address NRA_C for selecting one or more rows of normal memory cell rows of a first group.

At least one bit of the counting signal that is output from the normal cell address generator 420 may be applied to the refresh controller 410 and may be used to generate the second refresh signal RREF that enables a counting operation of the redundancy cell address generator 430. The refresh controller 410 may complementarily generate the first refresh signal NREF and the second refresh signal RREF by inactivating the first refresh signal NREF when the second refresh signal RREF is activated. A counting operation of the normal cell address generator 420 may be stopped in response to the inactivation of the first refresh signal NREF. In operation S520, the redundancy cell address generator 430 may output a counting signal by performing a counting operation in response to the second refresh signal RREF. The counting signal may be output as the redundancy cell refresh address RRA_C for selecting one or more rows of the redundancy memory cell rows.

The MSB of the counting signal that is output from the redundancy cell address generator 430 may be applied to the refresh controller 410 and may be used to inactivate the second refresh signal RREF. The refresh controller 410 may activate the first refresh signal NREF when the second refresh signal RREF is inactivated. In operation S530, the normal cell address generator 420 may output a counting signal by performing the counting operation that is stopped in response to the first refresh signal NREF, and the counting signal may be output as the normal cell refresh address NRA_C for normal memory cell rows of a second group. The normal memory cell rows of the second group are remaining normal memory cell rows other than the normal memory cell rows of the first group from among all of normal memory cell rows.

At least one bit of the counting signal that is output from the normal cell address generator 420 that activates the second refresh signal RREF may be applied to the refresh controller 410. The refresh controller 410 may inactivate the first refresh signal NREF and activate the second refresh signal RREF. In operation S540, the redundancy cell address generator 430 may output a counting signal by performing a counting operation in response to the second refresh signal RREF, and the counting signal may be output as the redundancy cell refresh address RRA_C for selecting one or more rows of the redundancy memory cell rows.

In one embodiment, a refresh operation may be performed after dividing normal memory cell rows into first and second groups. The refresh operation may be performed by generating refresh addresses for the normal memory cell rows of the first group, generating refresh addresses for all of redundancy memory cell rows, generating refresh addresses for the normal memory cell rows of the second group, and generating refresh addresses for all of the redundancy memory cell rows. Accordingly, normal memory cells of the normal memory cell rows may be refreshed during the refresh cycle tREF and redundancy memory cells of the redundancy memory cell rows may be refreshed for a cycle corresponding to a half of the refresh cycle tREF.

In another embodiment, the refresh operation may be performed after dividing normal memory cell rows into first through fourth groups. The refresh operation may be performed by generating refresh addresses for the normal memory cell rows of the first group, generating refresh addresses for all of redundancy memory cell rows, generating refresh addresses for the normal memory cell rows of the second group, generating refresh addresses for all of the redundancy memory cell rows, generating refresh addresses for the normal memory cell rows of the third group, generating refresh addresses for all of the redundancy memory cell rows, generating refresh addresses for the normal memory cell rows of the fourth group, and generating refresh addresses for all of the redundancy memory cell rows. Accordingly, normal memory cells of the normal memory cell rows may be refreshed during the refresh cycle tREF, and redundancy memory cells of the redundancy memory cell rows may be refreshed for a cycle corresponding to a quarter of the refresh cycle tREF.

Figure 6:
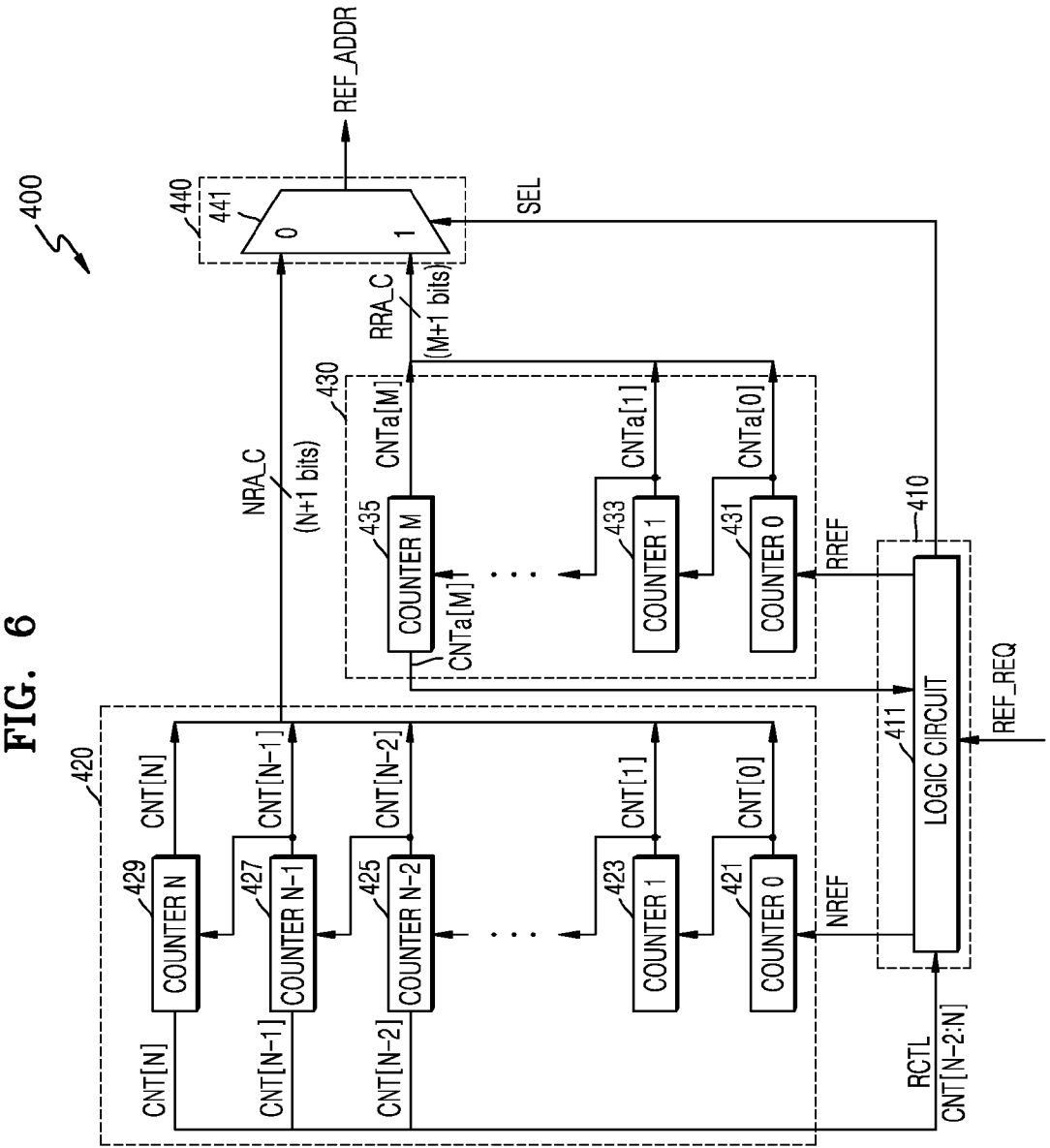
FIG. 6 is a diagram for explaining the refresh address generator of FIG. 4 according to an exemplary embodiment.

FIG. 6 is a diagram for explaining the refresh address generator 400 of FIG. 4.

Referring to FIG. 6, the refresh controller 410 may include a logic circuit 411 that generates the first refresh signal NREF and the second refresh signal RREF in response to the refresh request signal REF_REQ and the refresh cycle control signal RCTL. The logic circuit 411 may input three upper bits CNT[N−2:N] of counting signals CNT[0], CNT[1], . . . , CNT[N−2], CNT[N−1], and CNT[N] that are output from the normal cell address generator 420 as the refresh cycle control signal RCTL. One bit from among the three upper bits CNT[N−2:N] may be used as the refresh cycle control signal RCTL.

The logic circuit 411 may generate the first refresh signal NREF that enables a counting operation of the normal cell address generator 420 according to the refresh request signal REF_REQ.

The logic circuit 411 may generate, in response to the refresh request signal REF_REQ, the second refresh signal RREF that enables a counting operation of the redundancy cell address generator 430 in response to the refresh cycle control signal RCTL that is one bit from among the three upper bits CNT[N−2:N], and may inactivate the first refresh signal NREF. The logic circuit 411 may inactivate the second refresh signal RREF in response to an MSB CNTa[M] of the counting signals CNTa[0], CNTa[1], . . . , and CNTa[M] that is output from the redundancy cell address generator 430. The logic circuit 411 may generate the first refresh signal NREF according to the inactivation of the second refresh signal RREF.

The logic circuit 411 may generate the selection signal SEL having a logic high level that corresponds to a period for which the second refresh signal RREF is generated. The selection signal SEL may be applied to the address selector 440, and the normal cell refresh address NRA_C or the redundancy cell refresh address RRA_C may be selected and may be output as the refresh row address REF_ADDR.

The normal cell address generator 420 may include first through Nth counters 421, 423, 425, 427, and 429 that are serially connected to each other. The first counter 421 may generate a first bit CNT[0] in response to the first refresh signal NREF, the second counter 423 may generate a second bit CNT[1] in response to the first bit CNT[0], the N-2th counter 425 generate an N-2th bit CNT[N-2] in response to an N-3th bit, the N-1th counter 427 may generate an N-1th bit CNT[N-1]th bit in response to the N-2th bit CNT[N-2], and the Nth counter 429 may generate an Nth bit CNT[N] in response to the N-1th bit CNT[N-1].

The three upper bits CNT[N-2:N] that are generated by the N-2th counter 425, the N-1th counter 427, and the Nth counter 429 may be output as the refresh cycle control signal RCTL, and the first through Nth bits CNT[0], CNT[1], ..., CNT[N-2], CNT[N-1], and CNT[N] that are generated by the first through Nth counters 421, 423, 425, 427, and 429 may be output as the normal cell refresh address NRA_C. The normal cell refresh address NRA_C is used to refresh normal memory cells of the normal memory cell rows.

In an embodiment, when the N-1th bit CNT[N-1] of the counter 427 that is lower by one bit than that of the Nth counter 429 is used as the refresh cycle control signal RCTL, the normal memory cell rows may be set to be divided into two groups during the refresh cycle tREF and to be refreshed.

In another embodiment, when the N-2th bit CNT[N-2] of the counter 425 that is lower by two bits than that of the Nth counter 429 is used as the refresh cycle control signal RCTL, the normal memory cell rows may be set to be divided into four groups during the refresh cycle tREF and to be refreshed.

In general, when a particular normal memory cell of a specific normal memory cell row does not satisfy a predetermined retention time, the particular normal memory cell may be referred to as a weak cell. The weak cell may be refreshed during a shorter time than a non-weak cell. The particular normal memory cell row having a weak cell may be selected by a row address that may be referred to as a weak cell refresh address. For example, a word line containing one or more weak cells may be detected during testing after manufacturing the memory device. The row address of the word line having the weak cell may be stored in a fuse circuit, a register, or a non-volatile memory which may then be accessed by the memory device (or an external memory controller) to cause on or more additional refresh operations of the word line having the weak cell during each refresh cycle tREF. Accordingly, normal cell refresh addresses for refreshing non-weak cells may be generated by performing a counting operation and a weak cell refresh address for refreshing a weak cell may be generated from the storing circuit (e.g., a fuse circuit, a register, or a non-volatile memory). Weak cell refresh address generation may be in addition to or replacement of the same address being generated by a counter for normal refresh address generation. Weak cell refresh address generation may result in row addresses having weak cells being refreshed more than once per refresh cycle tREF. In addition, some word lines determined to be able to store data over two or more refresh cycles tREF may be detected by testing and have their row addresses stored in a storing circuit of the memory device 100 to be treated as "strong cell" word lines so that they need not be refreshed every refresh cycle tREF during operation.

Also, when a particular normal memory cell row is frequently accessed (e.g., exceeds a threshold value), normal memory cells arranged adjacent to the particular normal memory cell row may be disturbed, thereby degrading data retention characteristics. A data retention time of the normal memory cells arranged adjacent to the particular normal memory cell row may be shorter than a data retention time of the other normal memory cells (e.g., as compared to normal memory cells that are not adjacent to the frequently accessed particular normal memory cell row). For example, a row address of each normal memory cell row adjacent to the particular normal memory cell row having a number of accesses exceeding the threshold value (total or per some period of time) may be tracked, such as by having the row address of the particular normal memory cell row and/or of the adjacent normal memory cell rows stored in, for example, a register (e.g., a volatile register, such as an SRAM or look up table, either in the memory device 100 or an external memory controller). Accordingly, for at least some of the normal memory cell rows, additional normal cell refresh addresses for refreshing non-weak cells may be generated during a refresh cycle tREF. For example, refreshing of normal memory cell rows without any weak cells (e.g., those determined to have been possibly disturbed from reading an adjacent word line) may be refreshed during a refresh cycle tREF by performing a counting operation and by referencing the register.

The redundancy cell address generator 430 may include first through Mth counters 431, 433, and 435 that are serially connected to each other. The first counter 431 may generate a first bit CNTa[0] in response to the second refresh signal RREF, the second counter 433 may generate a second bit CNTa[1] in response to the first bit CNTa[0], and the Mth counter 435 may generate an Mth bit CNTa[M] in response to an M-1th bit CNTa[M-1]. First through Mth bits CNTa[0], CNTa[1], ..., and CNTa[M] that are generated by the first through Mth counters 431, 4233, and 435 may be output as the redundancy cell refresh address RRA_C. The redundancy cell refresh address RRA_C is used to refresh redundancy memory cells of the redundancy memory cell rows.

The address selector 440 may include a multiplexer 441 that selectively outputs the normal cell refresh address NRA_C or the redundancy cell refresh address RRA_C in response to the selection signal SEL. When the selection signal SEL has a logic low level, the multiplexer 441 may output the normal cell refresh address NRA_C as the refresh row address REF_ADDR, and when the selection signal SEL has a logic high level, the multiplexer 441 may output the redundancy cell refresh address RRA_C as the refresh row address REF_ADDR.

In one embodiment, when the N-1th bit CNT[N-1] of the normal cell address generator 420 is used as the refresh cycle control signal RCTL, the second refresh signal RREF may be activated whenever the N-1th bit CNT[N-1] toggles from a logic high level to a logic low level and may be inactivated whenever the Mth bit CNTa[M] of the redundancy cell address generator 430 toggles from a logic high level to a logic low level, by the logic circuit 411 of the refresh controller 410, according to the refresh request signal REF_REQ. Accordingly, the second refresh signal RREF may have two activation periods during the refresh cycle tREF. During the activation periods, the redundancy cell refresh address RRA_C may be output as the refresh row address REF_ADDR and redundancy memory cells of the redundancy memory cell rows may be refreshed. For example, redundancy memory cells of the redundancy memory cell rows may be refreshed twice during the refresh cycle tREF.

Figure 7A:
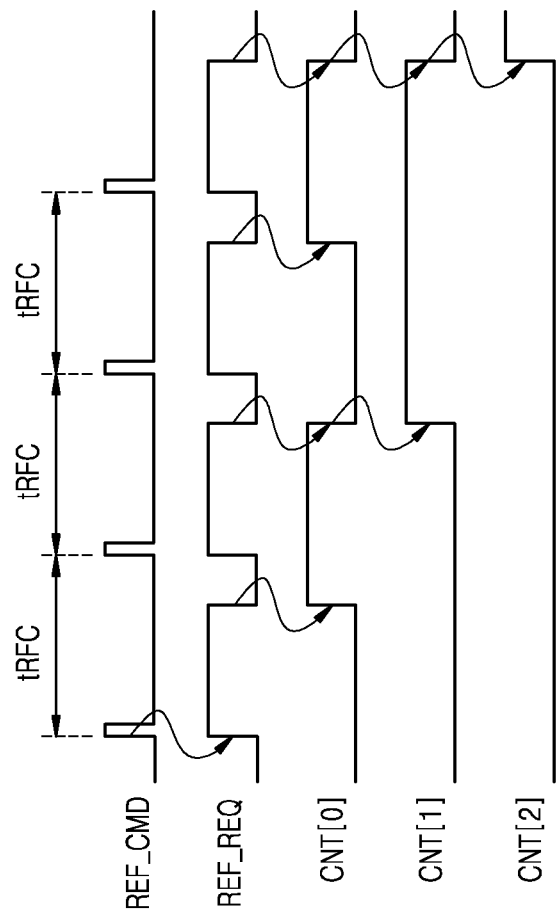
FIGS. 7A and 7B are timing diagrams for explaining an operation of the refresh address generator of FIG. 6, according to an exemplary embodiment of the inventive concept.
Figure 7B:
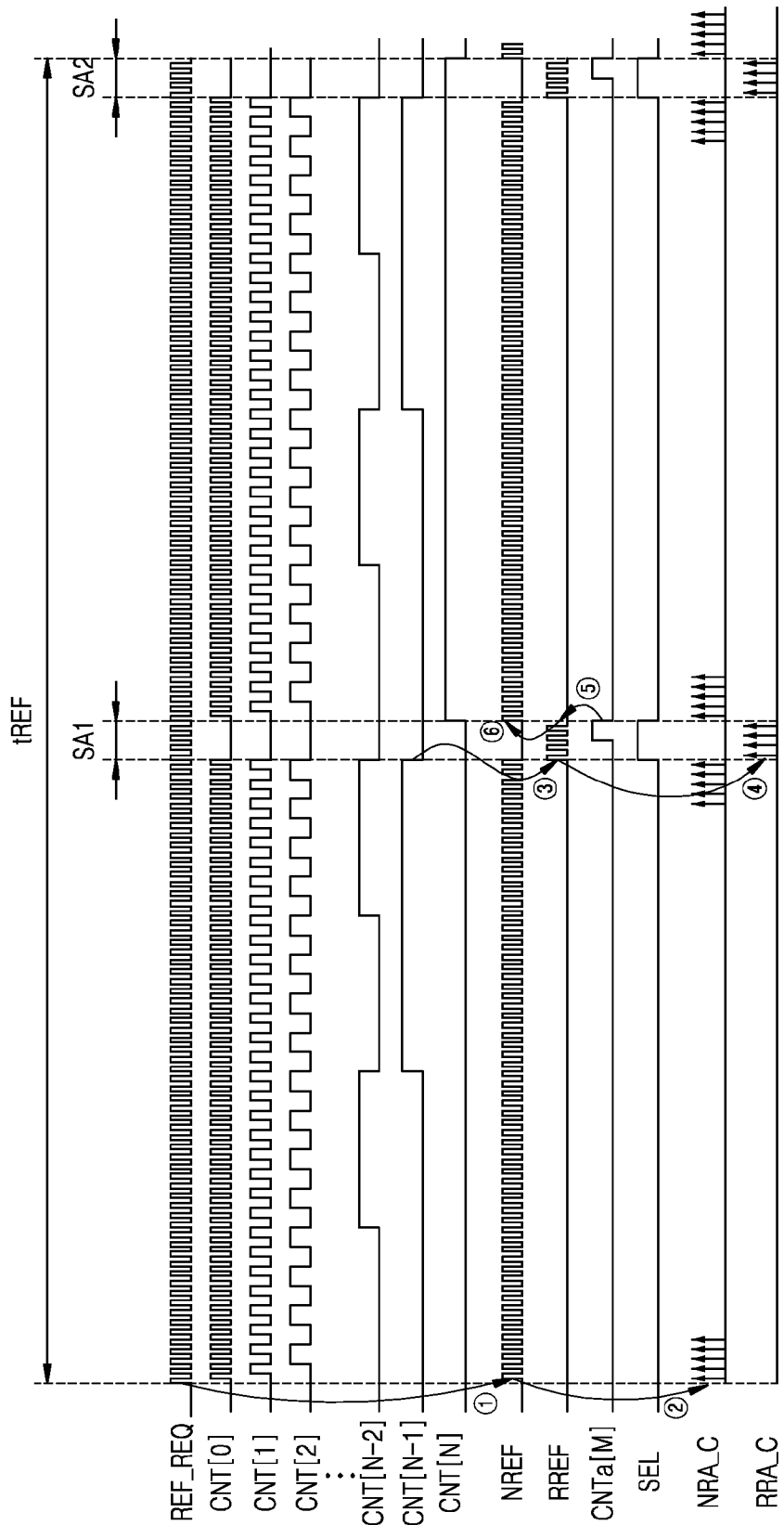

FIGS. 7A and 7B are timing diagrams for explaining an operation of the refresh address generator 400 of FIG. 6, according to an embodiment of the inventive concept.

Referring to FIG. 7A, the refresh request signal REF_REQ may be generated by the command decoder 120 (see FIG. 1) that receives the refresh command REF_CMD. The refresh command REF_CMD may be periodically applied at every refresh cycle tRFC that may be defined from the memory controller. The refresh request signal REF_REQ may be generated as a predetermined pulse for every refresh command REF_CMD, and a counting operation of the refresh address generator 400 may be performed during a period of the predetermined pulse.

When the refresh request signal REF_REQ toggles from a logic high level to a logic low level, the first bit CNT[0] of the normal cell address generator 420 may be generated, when the first bit CNT[0] toggles from a logic high level to a logic low level, the second bit CNT[1] may be generated, and when the second bit CNT[1] toggles from a logic high level to a logic low level, the third bit CNT[2] may be generated.

Referring to FIG. 7B, the first refresh signal NREF may be generated by the refresh cycle controller 410 that receives the refresh request signal REF_REQ (①). The first refresh signal NREF may be generated according to the refresh request signal REF_REQ.

The first through Nth bits CNT[0], CNT[1], . . . , CNT[2], CNT[N−1], and CNT[N] may be generated by the first through Nth counters 421, 423, 425, 427, and 429 of the normal cell address generator 420 in response to the first refresh signal NREF. The normal cell refresh address NRA_C may be sequentially output as the first bit CNT[0] toggles (②).

The second refresh signal RREF may be generated by the refresh controller 410 according to the refresh request signal REF_REQ when the N−1th bit CNT[N−1] toggles from a logic high level to a logic low level (③). During a period SA1 for which the second refresh signal RREF is generated, the first refresh signal NREF is inactivated to a logic low level and a counting operation of the first through Nth counters 421, 423, 425, 427, and 429 of the normal cell address generator 420 is stopped.

The first through Mth bits CNTa[0], CNTa[1], . . . , and CNTa[M] may be generated by the first through Mth counters 431, 433, and 435 of the redundancy cell address generator 430 in response to the second refresh signal RREF. The redundancy cell refresh address RRA_C may be sequentially output as the first bit CNTa[0] toggles (④).

The second refresh signal RREF is inactivated to a logic low level when the Mth bit CNTa[M] of the redundancy cell address generator 430 toggles from a logic high level to a logic low level (⑤).

When the second refresh signal RREF is inactivated to a logic low level, the first refresh signal NREF may be generated according to the refresh request signal REF_REQ (⑥), and the first through Nth counters 421, 423, 425, 427, and 429 of the normal cell address generator 420 may perform a counting operation from a point of time when the counting operation is stopped. The first through Nth bits CNT[0], CNT[1], . . . , CNT[2], CNT[N−1], and CNT[N] may be generated by the first through Nth counters 421, 423, 425, 427, and 429, and the remaining normal cell refresh address NRC_C may be sequentially output as the first bit CNT[0] toggles.

For example, the second refresh signal RREF may be generated according to the refresh request signal REF_REQ when the N−1th bit CNT[N−1] of the normal cell address generator 420 toggles from a logic high level to a logic low level, and the redundancy cell refresh address RRA_C may be sequentially output by the first through Mth counters 431, 433, and 435 of the redundancy cell address generator 430. During a period SA2 for which the second refresh signal RREF is generated, a counting operation of the first through Nth counters 421, 423, 425, 427, and 429 of the normal cell address generator 420 may be stopped. The second refresh signal RREF may be inactivated to a logic low level when the Mth bit CNTa[M] of the redundancy cell address generator 430 toggles from a logic high level to a logic low level.

Accordingly, the semiconductor memory device 100 including the refresh address generator 400, normal memory cells of the normal memory cell rows may be refreshed during the refresh cycle tREF and redundancy memory cells of the redundancy memory cell rows may be refreshed during a cycle corresponding to a half of the refresh cycle tREF.

Figure 8:
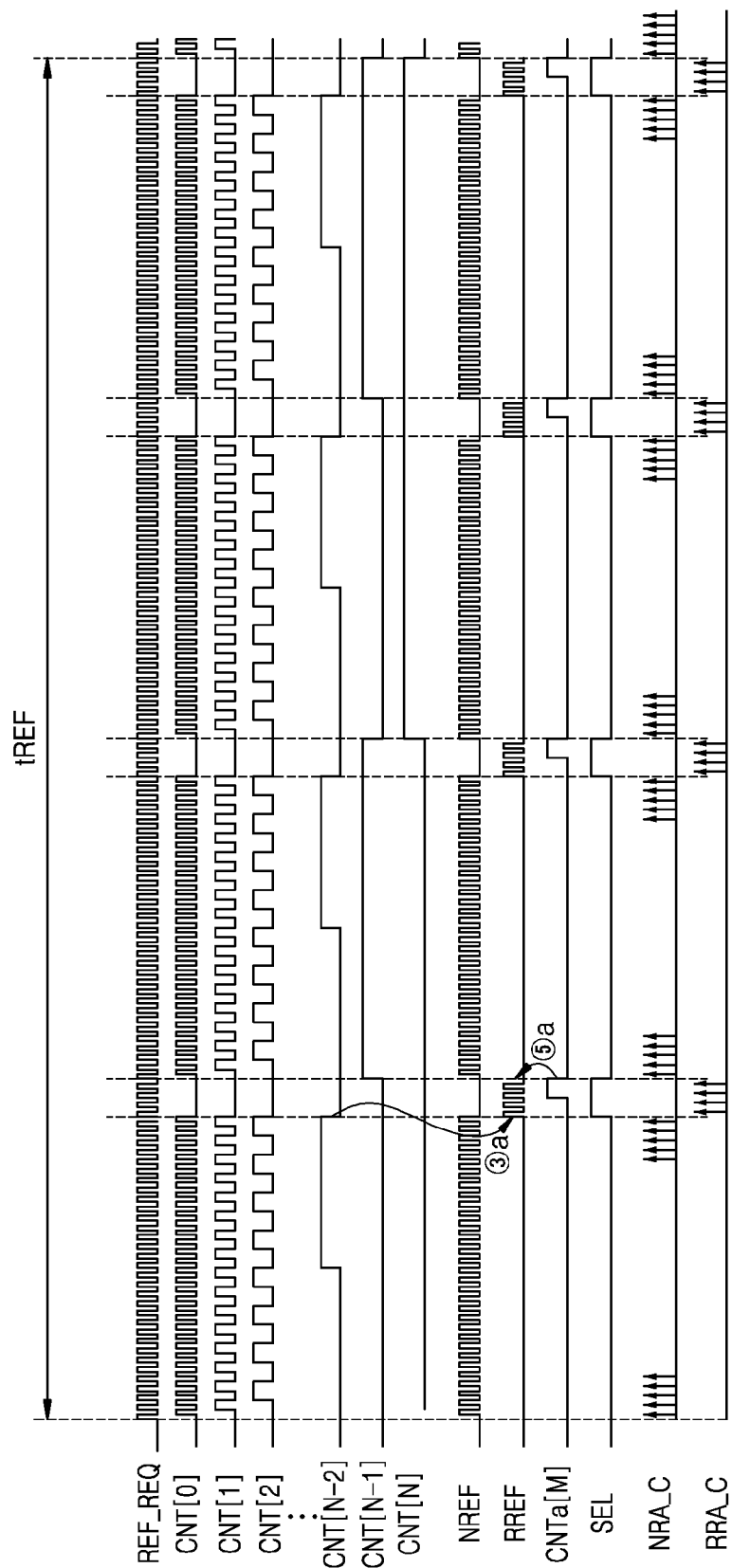
FIG. 8 is a timing diagram for explaining an operation of the refresh address generator of FIG. 6, according to another exemplary embodiment of the inventive concept.

FIG. 8 is a timing diagram for explaining an operation of the refresh address generator 400 of FIG. 6, according to another embodiment of the inventive concept.

Referring to FIG. 8, when compared with the timing diagram of FIG. 7B, there is a difference in that when the N−2th bit CNT[N−2] toggles from a logic high level to a logic low level, the second refresh signal RREF is generated according to the refresh request signal REF_REQ (③a), and when the Mth bit CNTa[M] of the redundancy cell address generator 430 toggles from a logic high level to a logic low level, the second refresh signal RREF is inactivated (⑤a). Accordingly, since the second refresh signal RREF may have four activation periods during the refresh cycle tREF, redundancy memory cells of the redundancy memory cell rows may be refreshed four times.

In the semiconductor memory device 100 including the refresh address generator 400, normal memory cells of the normal memory cell rows may be refreshed during the refresh cycle tREF and redundancy memory cells of the redundancy memory cell rows may be refreshed during a cycle corresponding to a quarter of the refresh cycle tREF.

Referring back to FIG. 1, in the memory cell array 110, the normal memory cell row NRAn of the normal memory cell array 12 is disposed adjacent to the redundancy memory cell row RRA1 of the redundancy memory cell array 114. When the redundancy memory cell row RRA1 is frequently accessed, the normal memory cell row NRAn may be disturbed. Accordingly, since a data retention time of the normal memory cells NMCs that are connected to the normal memory cell row NRAn may be reduced, normal memory cells NMCs of the memory cell row NRAn may be set to be refreshed during a cycle corresponding to a half or a quarter of the refresh cycle tREF, like redundancy memory cells RMCs of the redundancy memory cell rows.

Figure 9:
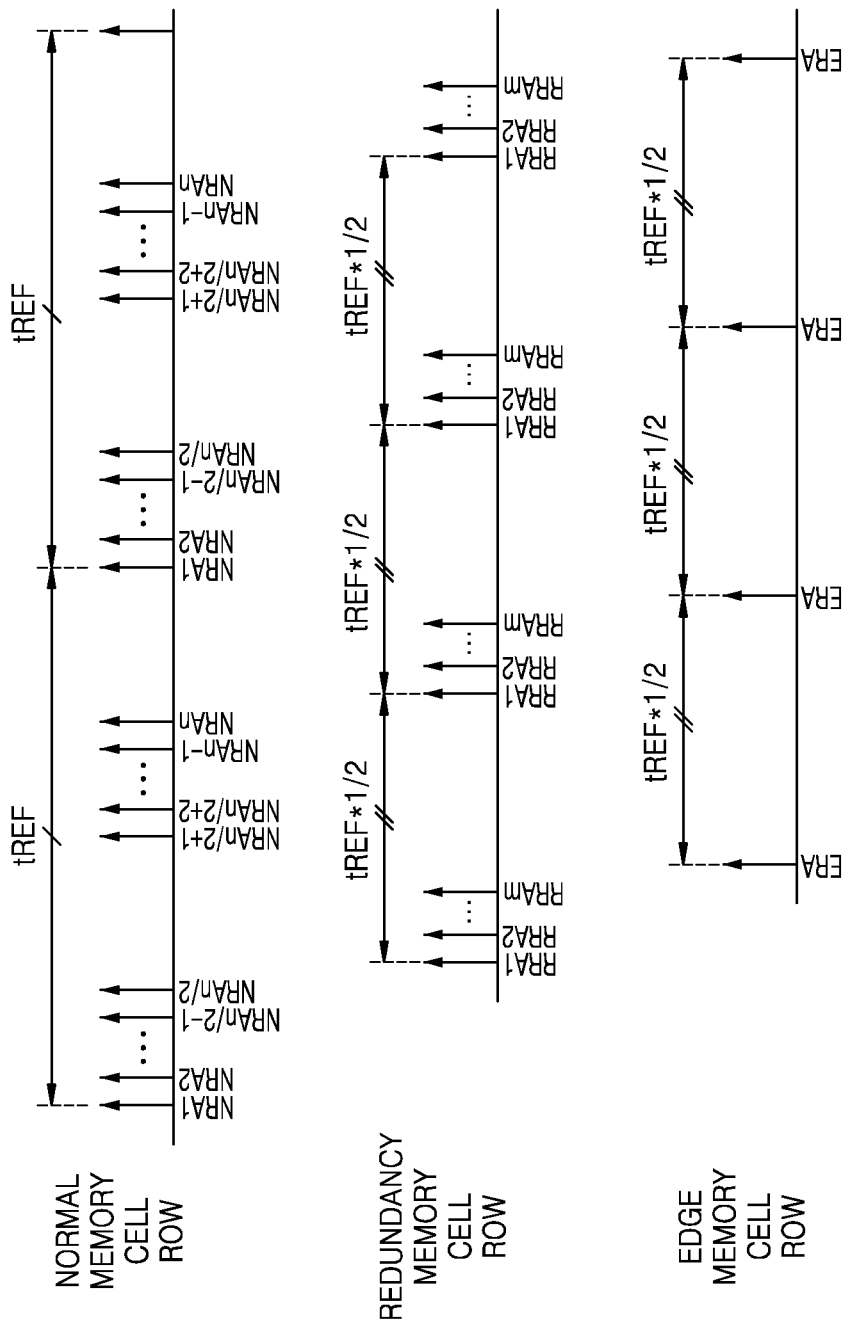
FIG. 9 is a timing diagram for explaining refreshing memory cells of memory cell rows performed according to a refresh operation of the semiconductor memory device of FIG. 1, according to another exemplary embodiment of the inventive concept.

FIG. 9 is a timing diagram for explaining refreshing memory cells of memory cell rows performed according to a refresh operation of the semiconductor memory device 100 of FIG. 1, according to another embodiment of the inventive concept.

Referring to FIG. 9, the normal memory cell rows NRA1 through NRAn may be divided into two groups (e.g., first and second groups) and normal memory cells of the normal memory cell rows NRA1 through NRAn may be refreshed during the refresh cycle tREF. A refresh operation for normal memory cells of the normal memory cell rows NRA1 through NRAn/2 of the first group may be performed and refresh operations for redundancy memory cells of the redundancy memory cell rows RRA1 through RRAm and normal memory cells of an edge memory cell row ERA may be performed. Next, a refresh operation for normal memory cells of the normal memory cell rows NRAn/2+1 through NRAn of the second group may be performed, and refresh operations for redundancy memory cells of the redundancy memory cell rows RRA1 through RRAm and normal memory cells of the edge memory cell row ERA may be performed.

Accordingly, in the semiconductor memory device 100 including the refresh address generator 400, normal memory cells of the normal memory cell rows may be refreshed once during the refresh cycle tREF, and normal memory cells of the edge memory cell row ERA and redundancy memory cells of the redundancy memory cell rows may be refreshed every half (or other fraction) of the refresh cycle tREF.

Figure 10:
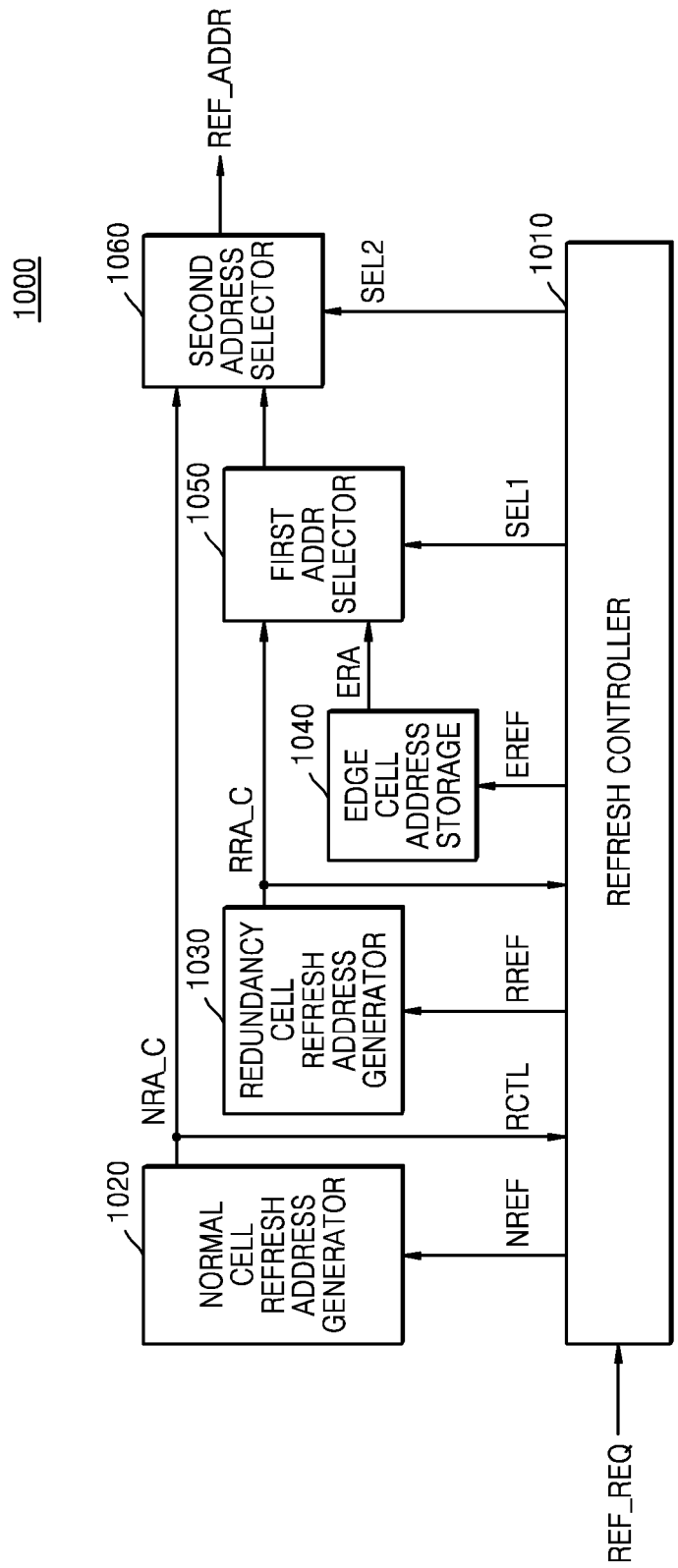
FIG. 10 is a block diagram for explaining a refresh address generator that is included in the semiconductor memory device of FIG. 1, according to another exemplary embodiment of the inventive concept.

FIG. 10 is a block diagram for explaining a refresh address generator 1000 that is included in the semiconductor memory device 100 of FIG. 1, according to another embodiment of the inventive concept.

Referring to FIG. 10, the refresh address generator 1000 may include a refresh controller 1010, a normal cell address generator 1020, a redundancy cell address generator 1030, an edge cell address storage unit 1040 (as used herein, a "unit" may refer to a "circuit"), a first address selector 1050, and a second address selector 1060.

The normal cell address generator 1020 and the redundancy cell address generator 1030 are almost the same as the normal cell address generator 420 and the redundancy cell address generator 430 of FIG. 4. The normal cell address generator 1020 and the redundancy cell address generator 1030 may sequentially output row addresses for selecting the normal memory cell rows NRA1 through NRAn and the redundancy memory cell rows RRA1 through RRAm by using a counter.

The normal cell address generator 1020 may generate a counting signal by performing a counting operation in response to the first refresh signal NREF. The normal cell address generator 1020 may output at least one bit of the counting signal as the refresh cycle control signal RCTL. For example, the normal cell address generator 1020 may generate a counting signal including N+1 bits (N is a natural number equal to or greater than 1), may output the counting signal including the N+1 bits as the normal cell refresh address NRA_C, and may output three upper bits of the counting signal as the refresh cycle control signal RCTL.

The redundancy cell address generator 1030 may generate a counting signal by performing a counting operation in response to the second refresh signal RREF. For example, the redundancy cell address generator 1030 may generate a counting signal including M+1 bits (M is a natural number equal to or greater than 1, M<N), and may output the counting signal including the M+1 bits as the redundancy cell refresh address RRA_C.

The refresh controller 1010 may generate the first refresh signal NREF, the second refresh signal RREF, and a third refresh signal EREF in response to the refresh request signal REF_REQ and the refresh cycle control signal RCTL. The refresh controller 1010 may generate a first selection signal SEL1 and a second selection signal SEL2 in response to the first refresh signal RREF and the third refresh signal EREF.

The first refresh signal NREF may be generated in response to the refresh request signal REF_REQ. The first refresh signal NREF, and the second and third refresh signals RREF and EREF may be complementarily generated. The second refresh signal RREF may be generated according to the refresh request signal REF_REQ in response to the MSB of the redundancy cell refresh address RRA_C and the refresh cycle control signal RCTL. The third refresh signal EREF may be generated according to the refresh request signal REF_REQ in response to the MSB of the redundancy cell refresh address RRA_C. The third refresh signal EREF may be generated according to the refresh request signal REF_REQ corresponding to the number of an edge cell refresh address ERA that is stored in the edge cell address storage unit 1040.

The first selection signal SEL1 may be generated at a logic high level to correspond to a period for which the third refresh signal EREF is generated. The second selection signal SEL2 may be generated at a logic high level to correspond to a period for which the second refresh signal RREF and the third refresh signal EREF are generated.

The edge cell address storage unit 1040 may store an address of a normal memory cell row that is corresponding to adjacent to a redundancy memory cell row of a redundancy memory cell array from among normal memory cell rows of the normal memory cell array 112. In FIG. 1, for example, address bits of the normal memory cell row NRAn that is corresponding to adjacent to the redundancy memory cell row RRA1 may be stored in the edge cell address storage unit 1040. Since the normal memory cell row NRAn is disposed on an edge of the normal memory cell array 112, the normal memory cell row NRAn may be set to be addressed by the edge cell refresh address ERA for the purpose of distinction.

According to embodiments, the edge cell address storage unit 1040 may be realized as a one-time programmable memory such as a laser-programmable fuse memory, an anti-fuse memory, or an electrical programmable fuse memory, or may be realized as a nonvolatile memory such as a magnetic random-access memory (MRAM), a resistive random-access memory (RRAM), a phase-change random-access memory (PRAM), or a flash memory.

The first address selector 1050 may selectively output the edge cell refresh address ERA that is applied from the edge cell address storage unit 1040 or the redundancy cell refresh address RRA_C that is applied from the redundancy cell address generator 1030 in response to the first selection signal SEL1. According to embodiments, the first address selector 1050 may include a multiplexer that selectively outputs the edge cell refresh address ERA or the redundancy cell refresh address RRA_C in response to the first selection signal SEL1.

The second address selector 1060 may selectively output the normal cell refresh address NRA_C that is applied from the normal cell address generator 1020, the redundancy cell refresh address RRA_C that is applied from the first address selector 1050, or the edge cell refresh address ERA in response to the second selection signal SEL2. According to embodiments, the second address selector 1060 may include a multiplexer that selectively outputs the normal cell refresh address NRA_C, the redundancy cell refresh address RRA_C, or the edge cell refresh address ERA in response to the second selection signal SEL2.

Figure 11:
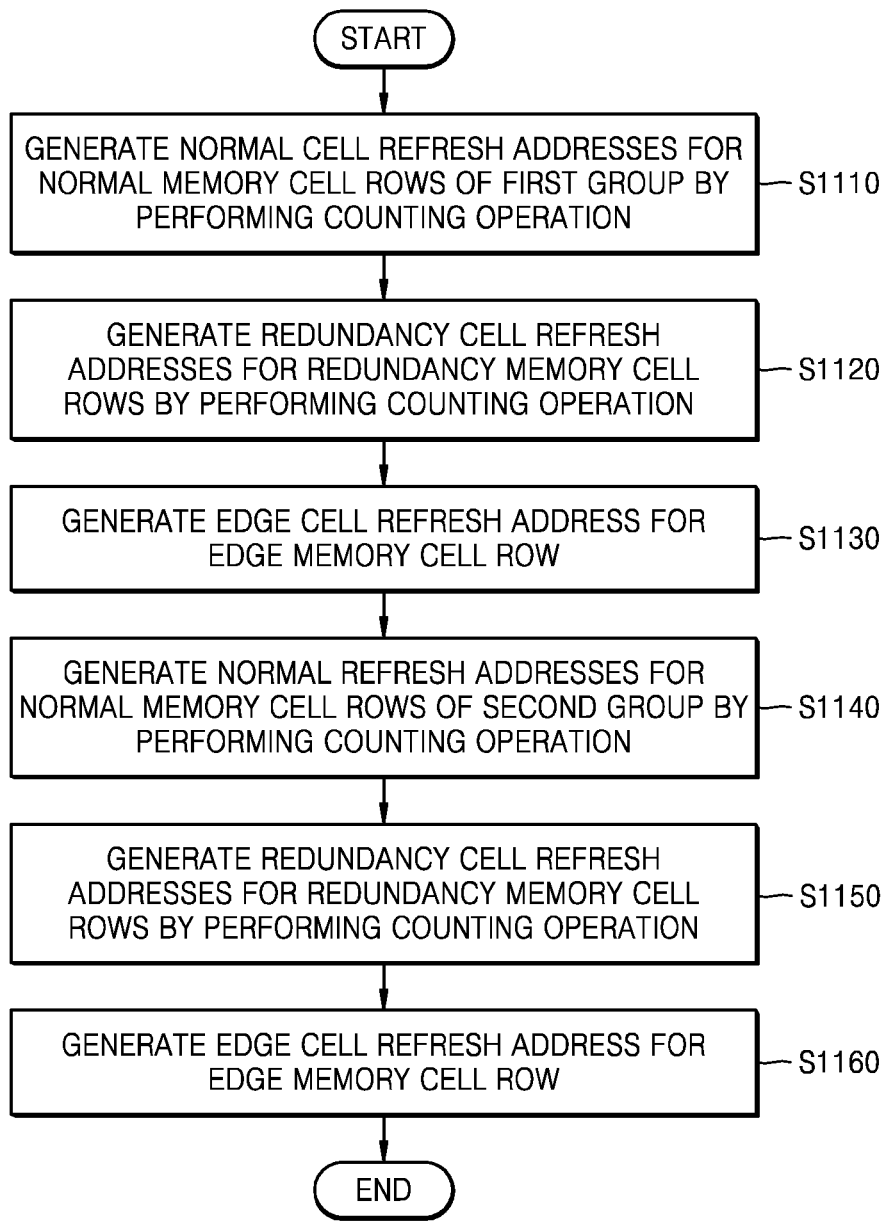
FIG. 11 is a flowchart for explaining a refresh method of the semiconductor memory device, according to another exemplary embodiment of the inventive concept.

FIG. 11 is a flowchart for explaining a refresh method of the semiconductor memory device 100, according to another example embodiment of the inventive concept.

Referring to FIG. 11 in association with FIG. 10, the refresh controller 1010 may generate, in response to the refresh request signal REF_REQ, the first refresh signal NREF that enables a counting operation of the normal cell address generator 1020. In operation S1110, the normal cell address generator 1020 may output a counting signal by performing a counting operation in response to the first refresh signal NREF and may output the counting signal as the normal cell refresh address NRA_C for selecting one or more rows of normal memory cell rows of a first group.

At least one bit of the counting signal that is output from the normal cell address generator 1020 may be applied to the refresh controller 1010 and may be used to generate the second refresh signal RREF that enables a counting operation of the redundancy cell address generator 1030. The refresh controller 1010 may inactivate the first refresh signal NREF when the second refresh signal RREF is activated. The counting operation of the normal cell address generator 1020 may be stopped in response to the first refresh signal NREF.

In operation S1120, the redundancy cell address generator 1030 may output a counting signal by performing a counting operation in response to the second refresh signal RREF, and the counting signal may be output as the redundancy cell refresh address RRA_C for redundancy memory cell rows.

The MSB of the counting signal that is output from the redundancy cell address generator 1030 may be applied to the refresh controller 1010 and may be used to inactivate the second refresh signal RREF and to activate the third refresh signal EREF. The refresh controller 1010 may generate and then inactivate the third refresh signal EREF according to the refresh request signal REF_REQ corresponding to the number of the edge cell refresh address ERA that is stored in the edge cell address storage unit 1040. In operation S1130, the edge cell address storage unit 1040 may output the edge cell refresh address ERA in response to the third refresh signal EREF.

The refresh controller 1010 may activate the first refresh signal NREF when the third refresh signal EREF is inactivated. In operation S1140, the normal cell address generator 1020 may output a counting signal by performing a counting operation that is stopped in response to the first refresh signal NREF, and the counting signal may be output as the normal cell refresh address NRA_C for normal memory cell rows of a second group. The normal memory cell rows of the second group are remaining normal memory cell rows other than the normal memory cell rows of the first group from among all of the normal memory cell rows.

At least one bit of the counting signal that is output from the normal cell address generator 1020 that activates the second refresh signal RREF may be applied to the refresh controller 1010. The refresh controller 1010 may inactivate the first refresh signal NREF and may activate the second refresh signal RREF. In operation S1150, the redundancy cell address generator 1030 may output a counting signal by performing a counting operation in response to the second refresh signal RREF, and the counting signal may be output as the redundancy cell refresh address RRA_C for redundancy memory cell rows.

The second refresh signal RREF may be inactivated and the third refresh signal EREF may be activated by the MSB of the redundancy cell address generator 1030. In operation S1160, the edge cell address storage unit 1040 may output the edge cell refresh address ERA in response to the third refresh signal EREF.

A refresh operation of the present embodiment may be performed after dividing normal memory cell rows into first and second groups and an edge memory cell row. The refresh operation may be performed by generating refresh addresses for the normal memory cell rows of the first group, generating refresh addresses for all of redundancy memory cell rows, generating a refresh address for the edge memory cell row, generating refreshes addresses for the remaining normal memory cell rows of the second group, generating refresh addresses for all of the redundancy memory cell rows, and generating a refresh address for the edge memory cell row. Accordingly, normal memory cells of the normal memory cell rows may be refreshed during the refresh cycle tREF, and redundancy memory cells of the redundancy memory cell rows and normal memory cells of the edge memory cell row may be refreshed during a cycle corresponding to a half of the refresh cycle tREF.

Figure 12:
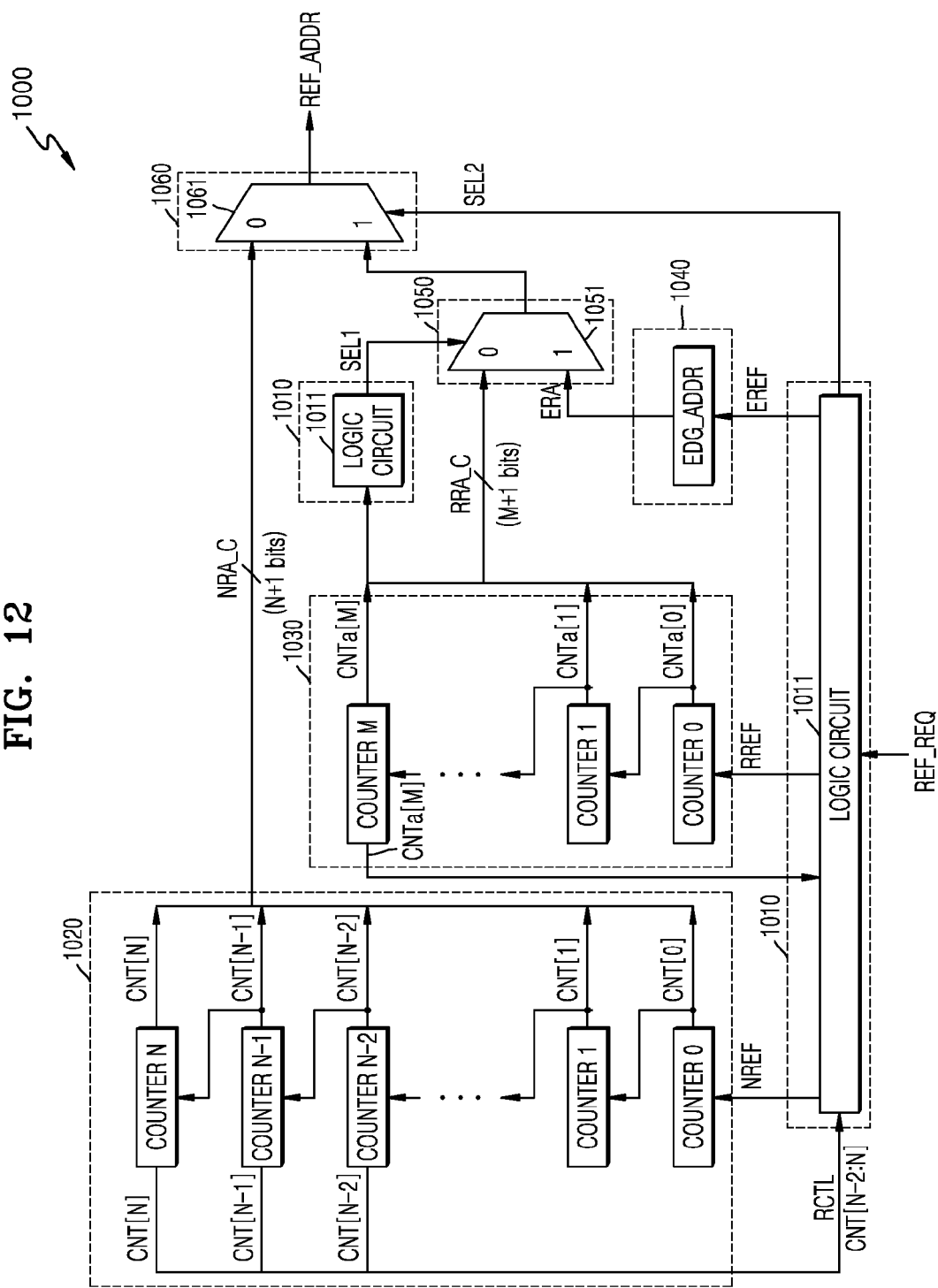
FIG. 12 is a diagram for explaining the refresh address generator of FIG. 10 according to an exemplary embodiment.

FIG. 12 is a diagram for explaining the refresh address generator 1000 of FIG. 10.

Referring to FIG. 12, the refresh controller 1010 may include a logic circuit 1011 that generates the first refresh signal NREF, the second refresh signal RREF, the third refresh signal EREF, the first selection signal SEL1, and the second selection signal SEL2 in response to the refresh request signal REF_REQ and the refresh cycle control signal RCTL. The logic circuit 1011 may input as the refresh cycle control signal RCTL the three upper bits CNT[N−2:N] of the counting signals CNT[0], CNT[1], . . . , CNT[N−2], CNT[N−1], and CNT[N] that are output from the normal cell address generator 1020. One bit of the three upper bits CNT[N−2:N] may be used as the refresh cycle control signal RCTL.

The logic circuit 1011 may generate the first refresh signal NREF that enables a counting operation of the normal cell address generator 1020 according to the refresh request signal REF_REQ.

The logic circuit 1011 may generate, according to the refresh request signal REF_REQ, the second refresh signal RREF that enables a counting operation of the redundancy cell address generator 1030 in response to the refresh cycle control signal RCTL that is one bit of the three upper bits CNT[N−2:N], and may inactivate the first refresh signal NREF. The logic circuit 1011 may inactivate the second refresh signal RREF in response to the MSB CNTa[M] of the counting signals CNTa[0], CNTa[1], . . . , and CNTa[M] that is output from the redundancy cell address generator 1030. For example, the logic circuit 1011 may generate the second refresh signal RREF according to the refresh request signal REF_REQ in response to the MSB of the redundancy cell refresh address RRA_C and the refresh cycle control signal RCTL.

The logic circuit 1011 may generate three fresh signals EREF according to the refresh request signal REF_REQ corresponding to the number of the edge cell refresh address ERA that is stored in the edge cell address storage unit 1040 in response to the MSB of the redundancy cell refresh address RRA_C.

The logic circuit 1011 may generate the first selection signal SEL1 having a logic high level corresponding to a period for which the third refresh signal EREF is generated. The first selection signal SEL1 may be applied to the first address selector 1050, and the edge cell refresh address ERA or the redundancy cell refresh address RRA_C may be selectively output and may be applied to the second address selector 1060.

The logic circuit 1011 may generate the second selection signal SEL2 having a logic high level corresponding to a period for which the second refresh signal RREF and the third refresh signal EREF are generated. The second selection signal SEL2 may be applied to the second address selector 1060, and the normal cell refresh address NRA_C that is applied from the normal cell address generator 1020, the redundancy cell refresh address RRA_C that is applied from the first address selector 1050, or the edge cell refresh address ERA may be selectively output as the refresh row address REF_ADDR.

The normal cell address generator 1020 may include first through Nth counters that are serially connected to each other. The first through Nth bits CNT[0], CNT[1], . . . , CNT[N−2], CNT[N−1], and CNT[N] may be generated by the first through Nth counters and may be output as the normal cell refresh address NRA_C. The three upper bits CNT[N−2:N] from among the first through Nth bits CNT[0], CNT[1], . . . , CNT[N−2], CNT[N−1], and CNT[N] may be applied as the refresh cycle control signal RCTL to the logic circuit 1011.

The redundancy cell address generator 1030 may include first through Mth counters that are serially connected to each other. The first through Mth bits CNTa[0], CNTa[1], . . . , and CNTa[M] may be generated by the first through Mth counters and may be output as the redundancy cell refresh address RRA_C. The MSB CNTa[M] from among the first through Mth bits CNTa[0], CNTa[1], . . . , and CNTa[M] may be applied to the logic circuit 1011 and may be used to generate the second refresh signal RREF and the third refresh signal EREF.

The edge cell address storage unit 1040 may store an address for the normal memory cell row NRAn that is corresponding to adjacent to the redundancy memory cell row RRA1 of the redundancy memory cell array 114 from among the normal memory cell rows NRA1 through NRAn of the normal memory cell array 112 (see FIG. 1). The edge cell address storage unit 1040 may output the address for selecting the normal memory cell row NRAn as the edge cell refresh address ERA in response to the third refresh signal EREF.

Figure 13:
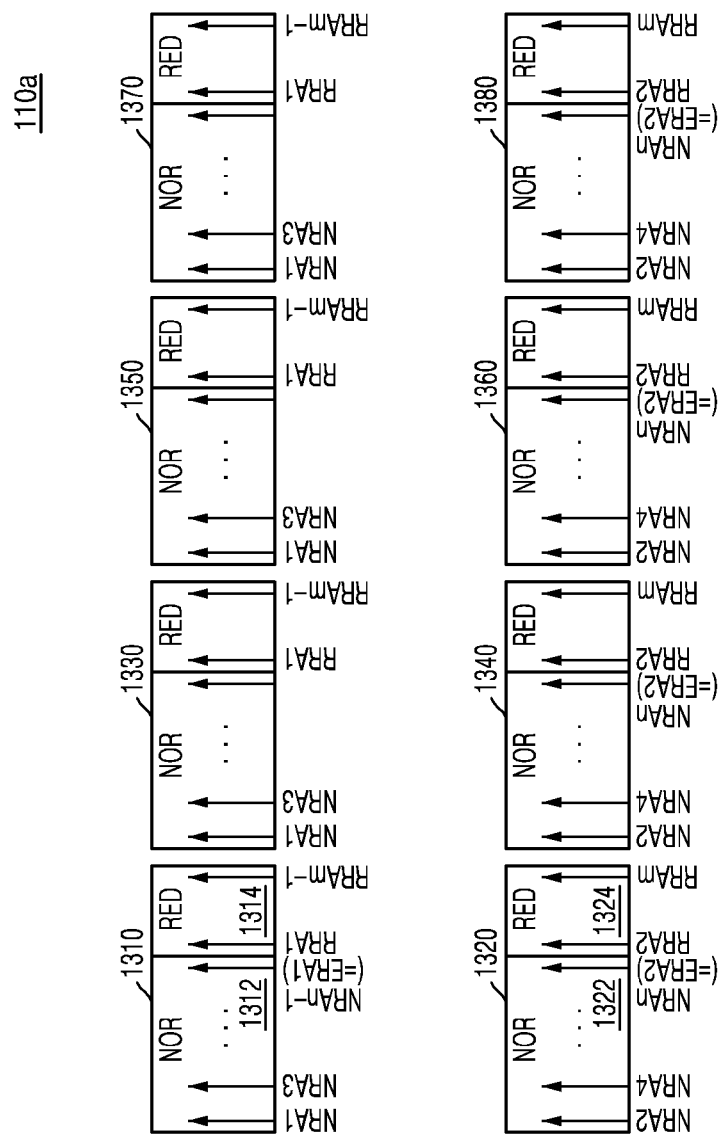
FIG. 13 is a block diagram for explaining a memory cell block of a memory cell array of FIG. 1 according to an exemplary embodiment.

According to embodiments, the edge cell address storage unit 1040 may output two or more edge cell refresh addresses ERA according to an arrangement of memory cell blocks of the memory cell array 110. As shown in FIG. 13, when a memory cell array 110a includes eight memory cell blocks, that is, first through eighth memory cell blocks 1310 through 1380, memory cells of four normal memory cell rows may be set to be refreshed by the refresh command REF_CMD. For example, each pair of memory cell blocks 1310 and 1320, 1330 and 1340, 1350 and 1360, or 1370 and 1380 may be set to be refreshed during the refresh cycle tREF.

When examining the first and second memory cell blocks 1310 and 1320, the first memory cell block 1310 may include a normal memory cell array 1312 and a redundancy memory cell array 1314, and the second memory cell block 1320 may include a normal memory cell array 1322 and a redundancy memory cell array 1324.

During the refresh cycle tREF, a normal cell refresh address for refreshing normal memory cells of the normal memory cell rows NRA1, NRA3, . . . , and NRAn−1 of the first memory cell block 1310 and a normal cell refresh address for refreshing normal memory cells of the normal memory cell rows NRA2, NRA4, . . . , and NRAn of the second memory cell block 1320 may be alternately output. A redundancy cell refresh address for refreshing redundancy memory cells of the redundancy memory cell rows RRA1, . . . , and RRAm−1 of the first memory cell block 1310 and a redundancy cell refresh address for refreshing redundancy memory cells of the redundancy memory cell rows RRA2, . . . , and RRAm of the second memory cell block 1320 may be alternately output. Accordingly, normal memory cells of the normal memory cell rows may be refreshed in an order of NRA1-NRA2-NRA3-NRA4- . . . -NRAn−1-NRAn and redundancy memory cells of the redundancy memory cell rows may be refreshed in an order of RRA1-RRA2- . . . -RRAm−1-RRAm.

In a normal access operation, since the normal memory cell rows NRAn−1 and NRAn are disposed adjacent to the redundancy memory cell rows RRA1 and RRA2, the normal memory cell rows NRAn−1 and NRAn may be disturbed when the redundancy memory cell rows RRA1 and RRA2 are frequently accessed. Accordingly, addresses corresponding to the normal memory cell rows NRAn−1 and NRAn may be stored as edge cell refresh addresses ERA1 and ERA2 in the edge cell address storage unit 1040 (see FIG. 12).

Referring back to FIG. 12, the first address selector 1050 may include a multiplexer 1051 that selectively outputs the redundancy cell refresh address RRA_C or the edge cell refresh address ERA in response to the first selection signal SEL1. When the first selection signal SEL1 has a logic low level, the multiplexer 1051 may output the redundancy cell refresh address RRA_C and when the first selection signal SEL1 has a logic high level, the multiplexer 1051 may output the edge cell refresh address ERA.

The second address selector 1060 may include a multiplexer 1061 that selectively outputs the normal cell refresh address NRA_C, or the redundancy cell refresh address RRA_C or the edge cell refresh address ERA that are output from the first address selector 1050, in response to the second selection signal SEL2. When the second selection signal SEL1 has a logic low level, the multiplexer 1061 may output the normal cell refresh address NRA_C as the refresh row address REF_ADDR and when the second selection signal SEL2 has a logic high level, the multiplexer 1061 may output the redundancy cell refresh address RRA_C or the edge cell refresh address ERA as the refresh row address REF_ADDR.

Figure 14:
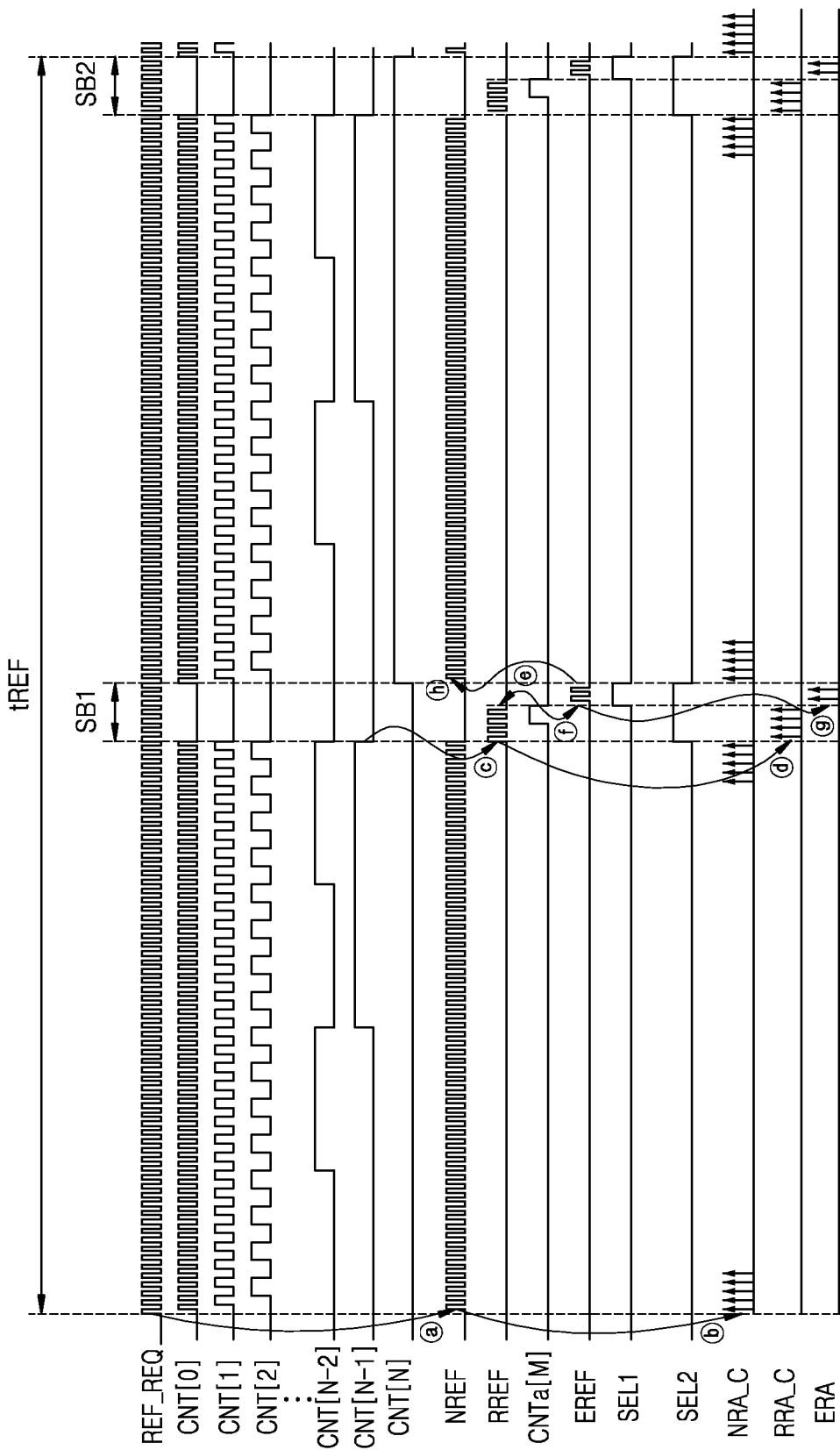
FIG. 14 is a timing diagram for explaining an operation of the refresh address generator of FIG. 12, according to an exemplary embodiment of the inventive concept.

FIG. 14 is a timing diagram for explaining an operation of the refresh address generator 1000 of FIG. 12, according to an embodiment of the inventive concept.

Referring to FIG. 14 in association with FIGS. 12 and 13, as described above with reference to FIG. 7B, the first refresh signal NREF may be generated in response to the refresh request signal REF_REQ (ⓐ). The first through Nth bits CNT[0], CNT[1], . . . , CNT[N−2], CNT[N−1], and CNT[N] may be generated by the normal cell address generator 1020 in response to the first refresh signal NREF. The normal cell refresh address NRA_C may be sequentially output as the first bit CNT[0] toggles (ⓑ).

When the N−1th bit CNT[N−1] toggles from a logic high level to a logic low level, the second refresh signal RREF may be generated by the refresh controller 1010 according to the refresh request signal REF_REQ (ⓒ). The first through Mth bits CNTa[0], CNTa[1], . . . , and CNTa[M] may be generated by the redundancy cell address generator 1030 in response to the second refresh signal RREF. The redundancy cell refresh address RRA_C may be sequentially output as the first bit CNTa[0] toggles (ⓓ).

When the Mth bit CNTa[M] of the redundancy cell address generator 1030 toggles from a refresh logic high level to a logic low level, the second refresh signal RREF may be inactivated to a logic low level (ⓔ).

Also, when the Mth bit CNTa[M] of the redundancy cell address generator 1030 toggles from a logic high level to a logic low level, the third refresh signal EREF may be generated according to the refresh request signal REF_REQ corresponding to the number of the edge cell refresh address ERA that is stored in the edge cell address storage unit 1040 (ⓕ). In the present embodiment, addresses corresponding to the normal memory cell rows NRAn−1 and NRAn of FIG. 13 are stored as the edge cell refresh addresses ERA1 and ERA2 in the edge cell address storage unit 1040.

The edge cell refresh addresses ERA1 and ERA2 of the edge cell address storage unit 1040 may be output in response to the third refresh signal EREF (ⓖ). During a period SB1 for which the second refresh signal RREF and the third refresh signal EREF are generated, the first refresh signal NREF is inactivated to a logic low level and a counting operation of the normal cell address generator 1020 is stopped.

When the third refresh signal EREF is inactivated to a logic low level, the first refresh signal NREF may be generated according to the refresh request signal REF_REQ (ⓗ), and the normal cell address generator 1020 may perform a counting operation from a point of time when the counting operation is stopped. The first through Nth bits CNT[0], CNT[1], . . . , CNT[N−2], CNT[N−1], and CNT[N] may be generated by the normal cell address generator 1020, and the remaining normal cell refresh address NRA_C may be sequentially output as the first bit CNT[0] toggles.

For example, when the N−1th bit CNT[N−1] of the normal cell address generator 1020 toggles from a logic high level to a logic low level, the second refresh signal RREF may be generated according to the refresh request signal REF_REQ. The redundancy cell refresh address RRA_C may be sequentially output by the redundancy cell address generator 1030 in response to the second refresh signal RREF.

When the Mth bit (e.g., MSB) CNTa[M] of the redundancy cell address generator 1030 toggles from a logic high level to a logic low level, the second refresh signal RREF may be inactivated to a logic low level, and the third refresh signal EREF may be generated according to the refresh request signal REF_REQ corresponding to the number of the edge cell refresh address ERA that is stored in the edge cell address storage unit 1040.

The edge cell refresh addresses ERA1 and ERA2 of the edge cell address storage unit 1040 may be output in response to the third refresh signal EREF. During a period SB2 for which the second refresh signal RREF and the third refresh signal EREF are generated, the first refresh signal NREF is inactivated to a logic low level and a counting operation of the normal cell address generator 1020 is stopped.

Accordingly, the semiconductor memory device 100 including the refresh address generator 1000, normal memory cells of the normal memory cell rows NRA1 through NRAn may be divided into two groups and then may be refreshed. A refresh operation for the normal memory cell rows NRA1 through NRAn/2 of a first group may be performed, and refresh operations for the redundancy memory cell rows RRA1 through RRAm and the edge memory cell rows ERA1 and ERA2 may be performed. Next, a refresh operation for the normal memory cell rows NRAn/2+1 through NRAn of a second group may be performed, and refresh operations for the redundancy memory cell rows RRA1 through RRAm and the edge memory cell rows ERA1 and ERA2 may be performed. Accordingly, normal memory cells of the normal memory cell rows NRA1 through NRAn may be refreshed during the refresh cycle tREF, and redundancy memory cells of the redundancy memory cell rows RRA1 through RRAm and normal memory cells of the edge memory cell rows NRAn−1 and NRAn may be refreshed during a cycle corresponding to a half of the refresh cycle tREF.

According to embodiments, when the N−2th bit CNT[N−2] of the normal cell address generator 1020 is used as the refresh cycle control signal RCTL, the second refresh signal RREF and the third refresh signal EREF may have four activation periods during the refresh cycle tREF. Accordingly, normal memory cells of the normal memory cell rows NRA1 through NRAn may be refreshed during the refresh cycle tREF, and redundancy memory cells of the redundancy memory cell rows RRA1 through RRAm and normal memory cells of the normal memory cell rows NRAn−1 and NRAn that are normal memory cells of the edge memory cell rows may be refreshed during a cycle corresponding to a quarter of the refresh cycle tREF.

Figure 15:
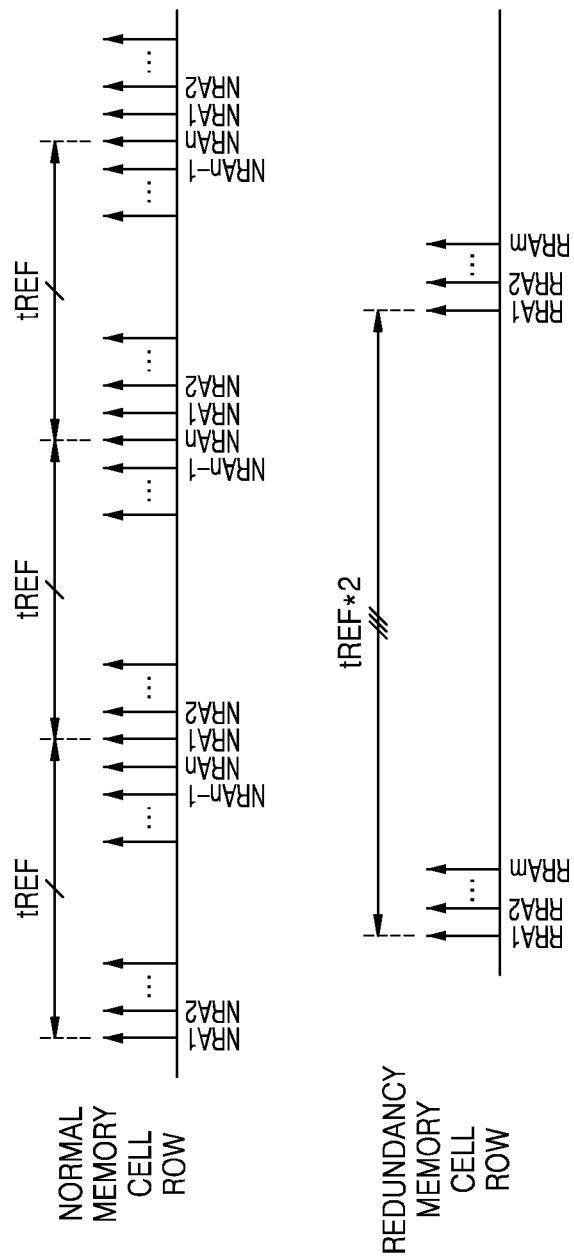
FIG. 15 is a timing diagram for explaining refreshing memory cells of memory cell rows performed according to a refresh operation of the semiconductor memory device of FIG. 1, according to another exemplary embodiment of the inventive concept.

FIG. 15 is a timing diagram for explaining refreshing memory cells of memory cell rows performed according to a refresh operation of the semiconductor memory device 100 of FIG. 1, according to another embodiment of the inventive concept.

Referring to FIG. 15, refresh operations for the normal memory cell rows NRA1 through NRAn may be performed during the refresh cycle tREF, and refresh operations for the redundancy memory cell rows RRA1 through RRAm may be performed during a cycle corresponding to a double of the refresh cycle tREF.

A data retention time of redundancy memory cells that are connected to the redundancy memory cell rows RRA1 through RRAm may be two times longer than the refresh cycle tREF. Each of the redundancy memory cells RRA1 through RRAm may be twin redundancy memory cells. The twin redundancy memory cells may prevent a data retention time from being reduced even when redundancy memory cells are frequently accessed and their adjacent redundancy memory cells are disturbed.

Figure 16:
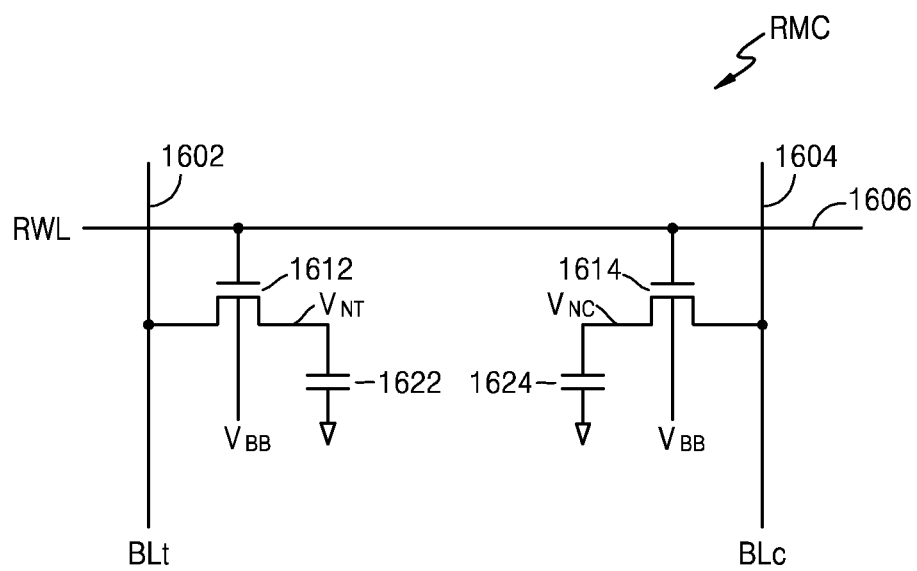
FIG. 16 is a diagram for explaining the redundancy memory cell that is included in the semiconductor memory device of FIG. 1, according to another exemplary embodiment of the inventive concept.

FIG. 16 is a diagram for explaining the redundancy memory cell RMC that is included in the semiconductor memory device 100 of FIG. 1, according to another embodiment of the inventive concept.

Referring to FIG. 16, the redundancy memory cell RMC is a twin dynamic random-access memory (DRAM) cell. The redundancy memory cell RMC may include two NMOS access transistors 1612 and 1614 and two capacitors 1622 and 1624. The NMOS access transistors 1612 and 1614 may be used to access the capacitors 1622 and 1624, and the capacitors 1622 and 1624 may be used to store data in the redundancy memory cell RMC.

The NMOS access transistors 1612 and 1614 may be controlled by a redundancy word line RWL 1606 to which gates of the NMOS transistors 1612 and 1614 are connected. The redundancy memory cell RMC stores a binary bit and a complementary bit of the binary bit (for example, '0 and 1' or '1 and 0'). The binary bit and the complementary bit may be stored in the capacitors 1624 and 1622, respectively. When the redundancy memory cell RMC is accessed, the binary bit and the complementary bit that are stored in the capacitors 1624 and 1622 may be respectively output to a bit line BLt 1604 and a complementary bit line BLc 1602.

Figure 17:
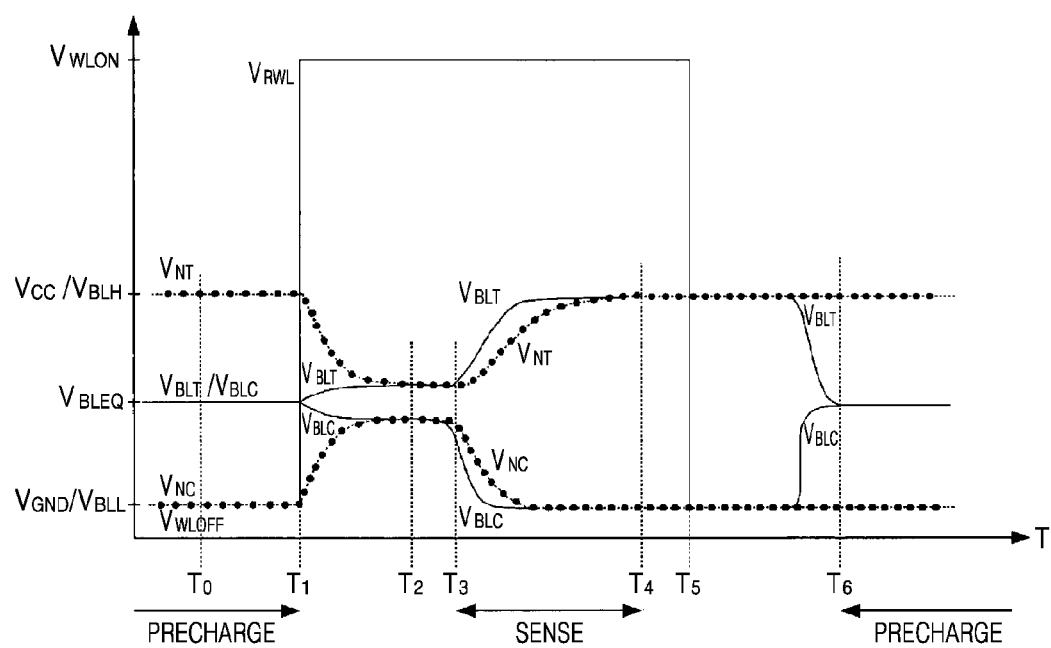
FIG. 17 is a timing diagram for explaining an access to the redundancy memory cell of FIG. 16 according to an exemplary embodiment.

FIG. 17 is a timing diagram for explaining an access to the redundancy memory cell RMC of FIG. 16.

Referring to FIG. 17, since a redundancy word line voltage $V_{RWL}$ is a ground voltage $V_{GND}$ or a word line-off voltage $V_{WLOFF}$ at a time $T_0$ before an access, the capacitors 1622 and 1624 and the bit lines 1602 and 1604 are not connected. The word line-off voltage $V_{WLOFF}$ may be a low voltage that is boosted to a low level by a charge pump. A high voltage $V_{NT}$ (e.g., $V_{CC}$) indicating a logic value "1" may be stored in the capacitor 1622 that is a true capacitor of the redundancy memory cell RMC, and a low voltage $V_{NC}$ (e.g., $V_{GND}$) indicating a logic value "0" may be stored in the capacitor 1624 that is a complementary capacitor.

Before the redundancy memory cell RMC is accessed, the bit lines 1602 and 1604 may be precharged to an equalizing voltage $V_{BLEQ}$. The precharging may be performed to equalize voltage levels of the bit lines 1602 and 1604 remaining after a previous access using the bit lines 1602 and 1604.

The precharging may prevent data that is stored in the redundancy memory cell RMC from being destroyed and may allow a low voltage that is used to store data in the redundancy memory cell RMC to be correctly detected.

The redundancy memory cell RMC may begin to be accessed at a time $T_1$. The redundancy word line voltage $V_{RWL}$ may be applied as a word line-on voltage $V_{WLON}$, and the word line-on voltage $V_{WLON}$ that has a level high enough to turn on the NMOS transistors 1612 and 1614 may be a high voltage VPP that is pumped to a high level by the charge pump. When the NMOS transistors 1612 and 1614 are turned on, voltages $V_{NC}$ and $V_{NT}$ that are stored in the capacitors 1622 and 1624 are driven by the bit lines 1602 and 1604, and thus the voltage $V_{NT}$ may be reduced and the voltage $V_{NC}$ may be increased to be the equalizing voltage $V_{BLEQ}$. As the voltages $V_{NT}$ and $V_{NC}$ that are stored in the capacitors 1622 and 1624 are driven by the bit lines 1602 and 1604, at a time $T_2$, a voltage difference $V_{BLT}$-$V_{BLC}$ between the bit line BLt 1602 that is a true bit line and the bit line BLc 1604 that is a complementary bit line may occur.

At a time $T_3$, a sense amplifier that is connected to the bit lines 1602 and 1604 may be enabled. The sense amplifier may be used to sense and amplify the voltage difference $V_{BLT}$-$V_{BLC}$ that occurs between the bit lines 1602 and 1604 by the redundancy memory cell RMC. Accordingly, during a period from the time $T_3$ to a time $T_4$, the voltage difference $V_{BLT}$-$V_{BLC}$ may be amplified, the voltage $V_{BLT}$ may be driven to a bit line high voltage $V_{BLH}$, and the voltage $V_{BLC}$ may be driven to a bit line low voltage $V_{BLL}$. Since the NMOS transistors 1612 and 1614 are continuously turned on, the voltage $V_{NT}$ may also be driven to the bit line high voltage $V_{BLH}$ and the voltage $V_{NC}$ may be driven to the bit line low voltage $V_{BLL}$.

Due to a leakage current of the redundancy memory cell RMC, the voltages $V_{NC}$ and $V_{NT}$ may be reduced as time passes. However, when an access operation of the redundancy memory cell RMC is performed, since the voltage $V_{NT}$ is driven to the bit line high voltage $V_{BLH}$ and the voltage $V_{NC}$ is driven to the bit line low voltage $V_{BLL}$, data that is stored in the capacitors 1622 and 1624 of the redundancy memory cell RMC is refreshed.

At a time $T_5$, the redundancy word line voltage $V_{RWL}$ is reduced to the ground voltage $V_{GND}$ or the word line-off voltage $V_{WLOFF}$, connection between the capacitors 1622 and 1624 and the bit lines 1602 and 1604 is cut off, and the access is completed. Next, at a time $T_6$, the bit line voltage $V_{BLT}$ that is a true bit line voltage and the bit line voltage $V_{BLC}$ that is a complementary bit line voltage of the bit lines 1602 and 1604 are driven to be the equalizing voltage $V_{BLEQ}$ and a next access to the bit lines 1602 and 1604 is prepared.

Since the twin redundancy memory cell RMC of the present embodiment is refreshed by an access operation, data retention characteristics may be improved. Accordingly, the twin redundancy memory cell RMC may be refreshed during a cycle that is longer than the refresh cycle tREF. According to embodiments, the twin redundancy memory cell RMC may be refreshed during a cycle that corresponds to a double of the refresh cycle tREF.

In order to secure sufficient yield of the semiconductor memory device 100, defective memory cells may be repaired by redundancy memory cells. However, sufficient yield may not be secured with only a redundancy repair operation. Accordingly, a method of controlling errors by using an error-correction code (ECC) operation in the semiconductor memory device 100 is suggested.

The ECC operation functions to detect errors that may occur during a process of writing and reading data and correct the errors. In order to provide data integrity, the semiconductor memory device 100 may employ an ECC circuit. The ECC circuit may perform an ECC operation using parity bits during a process of detecting/correcting errors.

Figure 18:
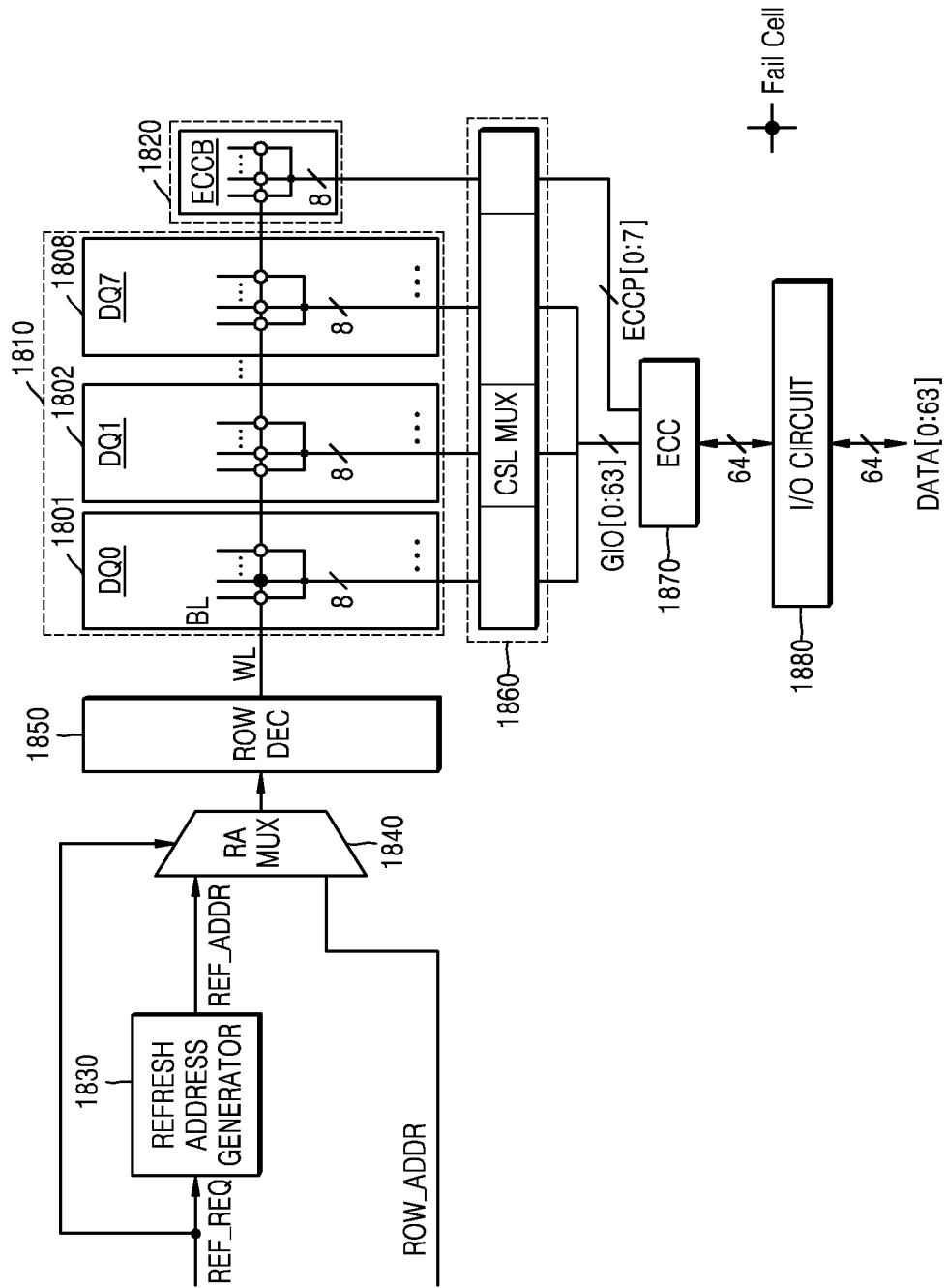
FIG. 18 is a diagram for explaining a semiconductor memory device for controlling a refresh operation according to an example embodiment of the inventive concept.

FIG. 18 is a diagram for explaining a semiconductor memory device 1800 for controlling a refresh operation according to another embodiment of the inventive concept.

Referring to FIG. 18, the semiconductor memory device 1800 includes a main memory cell block 1810, an ECC memory cell block 1820, a refresh address generator 1830, a row address multiplexer 1840, a row decoder 1850, a column selector 1860, an ECC circuit 1870, and an input/output circuit 1880.

The main memory cell block 1810 includes a plurality of memory cell blocks 1801 through 1808. A plurality of memory cells that are arranged in rows and columns are arranged in each of the memory cell blocks 1801 through 1808. Since data that is stored in the memory cells of the memory cell blocks 1801 through 1808 is input/output through data input/output pads DQ0 through DQ7, for convenience of explanation, the memory cell blocks 1801 through 1808 are referred to as DQ0 through DQ7 cell blocks 1801 through 1808.

In the ECC memory cell block 1820, a plurality of memory cells are arranged in rows and columns. The number of the rows of the ECC memory cell block 1820 may be less than the number of the rows of the DQ0 through DQ7 cell blocks 1801 through 1808. For example, when the ECC memory cell block 1820 is set to perform an ECC operation only for word lines WLs with defective cells in the DQ0 through DQ7 cell blocks 1801 through 108, the number of the rows of the ECC memory cell block 1820 may be less than the number of the rows of the DQ0 through DQ7 cell blocks 1801 through 1808.

The number of the columns of the ECC memory cell block 1820 may be less than the number of the columns of the DQ0 through DQ7 cell blocks 1801 through 1808. For example, the columns of the ECC memory cell block 1820 may correspond to a burst length (BL) that is set in the semiconductor memory device 1800. The ECC memory cell block 1820 may store parity bits for detecting and correcting errors that may occur during a process of writing and reading data to/from the DQ0 through DQ7 cell blocks 1801 through 1808.

The refresh address generator 1830 may generate the refresh row address REF_ADDR so that the memory cells NMCs of the memory cell blocks 1801 through 1808 are refreshed during the refresh cycle tREF and memory cells of the ECC memory cell block 1820 are refreshed during a cycle that is different from the refresh cycle tREF.

The row address multiplexer 1840 may selectively output a row address ROW_ADDR that is output from an address register or the refresh row address REF_ADDR that is output from the refresh address generator 1830 in response to the refresh request signal REF_REQ and may apply the selected address to the row decoder 1850.

During a normal operation of the semiconductor memory device 1800, the row decoder 1850 may activate the word line WL corresponding to the row address ROW_ADDR by decoding the row address ROW_ADDR that is selected by the row address multiplexer 1840. The word lines WLs of the DQ0 through DQ7 cell blocks 1801 through 1808 may be accessed by the row addresses ROW_ADDR and the bit lines BLs may be accessed by column addresses. The column addresses may be decoded by a column decoder, may be generated as column selection signals for selecting the bit lines BLs, and may be applied to the column selector 1860.

According to embodiments, in order for the bit lines BLs to support the BL indicating a maximum number of accessible column locations, the bit lines BLs corresponding to the BL may be simultaneously accessed. For example, the BL may be set to 8. The column selector 1860 may allow eight bit lines BLs to be simultaneously selected respectively by the DQ0 through DQ7 cell blocks 1801 through 1808 in response to a column selection signal. Accordingly, data DATA[0:63] to be written to the DQ0 through DQ7 cell blocks 1801 through 1808 may be applied to the DQ0 through DQ7 cell blocks 1801 through 1808 through the eight bit lines BLs of each of the DQ0 through DQ7 cell blocks 1801 through 1808 and 64 data lines GIO[0:63].

In the DQ0 through DQ7 cell blocks 1801 through 1808, there may exist one defective cell from among a plurality of memory cells that are connected to the word line WL. For example, there may exist one defective cell (marked by •) in the DQ0 cell block 1801 from among the memory cells of the DQ0 through DQ7 cell blocks 1801 through 1808 selected by the eight bit lines BLs and the word line WL. The defective cell (marked by •) may not be a defective cell of the DQ0 cell block 1801 but may be one defective cell that exists from among the memory cells selected by the seven bit lines BLs and the word line WL in the DQ1 through DQ7 cell blocks 1802 through 1808.

The ECC circuit 1870 may detect and correct the defective cell of the DQ0 through DQ7 cell blocks 1801 through 1808. During a write operation of the ECC circuit 1870, parity bits for the data DATA[0:63] may be generated and may be applied to a parity data line ECCP[0:7]. The parity bits on the parity data line ECCP[0:7] may be stored in memory cells of the ECC cell block 1820 that is connected to the word line WL of the defective cell.

During a read operation of the ECC circuit 1870, the ECC circuit 1870 may receive data that is read from the DQ0 through DQ7 cell blocks 1801 through 1808 and is transmitted to the data lines GIO[0:63] and data that is read from the ECC cell block 1820 and is transmitted to the parity data line ECCP[0:7]. The ECC circuit 1870 may generate syndrome data by using the data transmitted to the data lines GIO[0:63] and to the parity data line ECCP[0:7], may calculate an error bit location, may correct data corresponding to the error bit location, and may output the data DATA[0:63] that is error-corrected.

During a refresh operation of the semiconductor memory device 1800, the row decoder 1850 may activate the word line WL corresponding to the refresh row address REF_ADDR by decoding the refresh row address REF_ADDR that is selected by the row address multiplexer 1840. For convenience of explanation, as shown in FIG. 19, the word lines WLs of the main memory cell blocks 1801 through 1808 are referred to as main memory cell rows MRA1 through MRAn (n is a natural number) and the word lines WLs of the ECC cell block 1820 are referred to as ECC memory cell rows ECCRA1 through ECCRAi (i<n).

Figure 20:
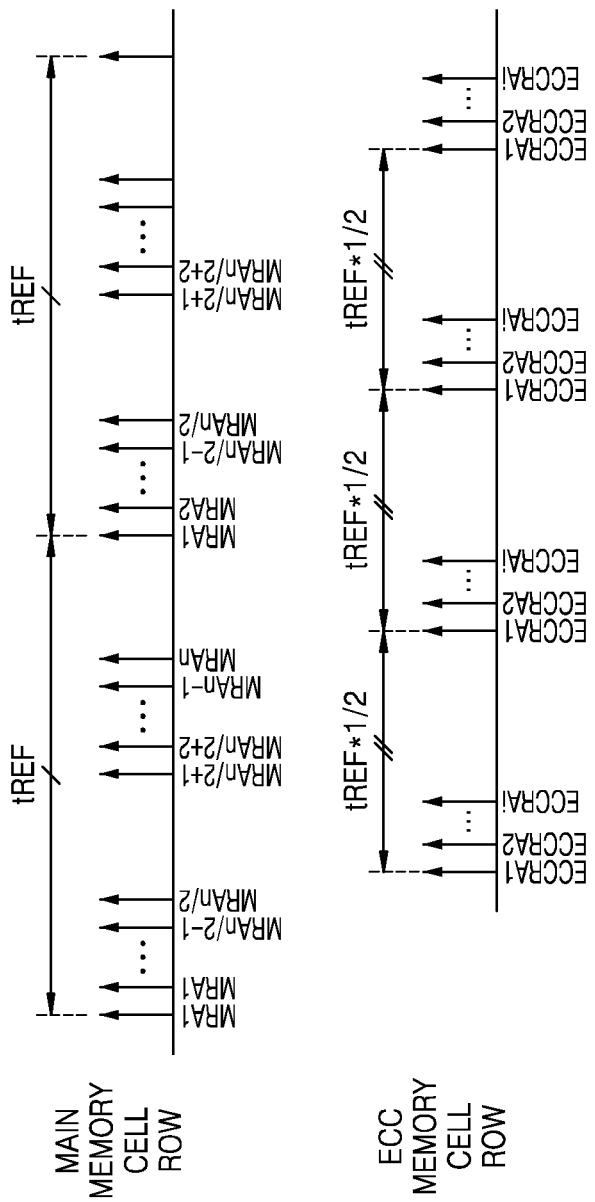
FIG. 20 is a timing diagram for explaining refreshing of memory cell rows performed according to a refresh operation of the semiconductor memory device of FIG. 18 according to an exemplary embodiment.

FIG. 20 is a timing diagram for explaining of refreshing memory cells of memory cell rows performed according to a refresh operation of the semiconductor memory device 1800 of FIG. 18.

Figure 19:
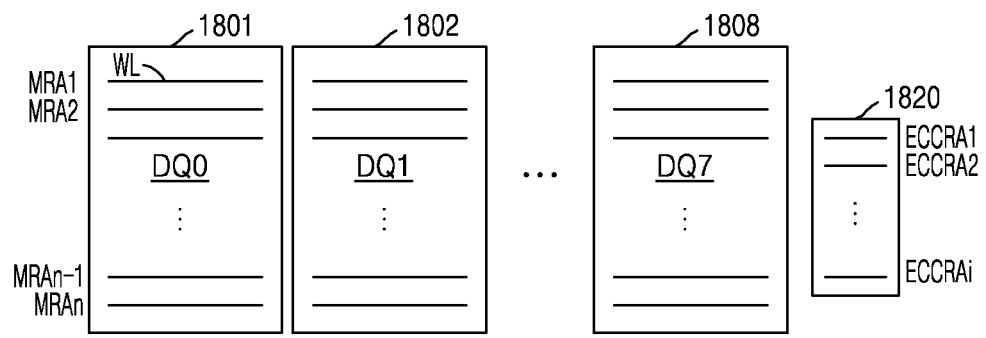
FIG. 19 is a block diagram for explaining memory cell blocks of FIG. 18 according to an exemplary embodiment.

Referring to FIG. 20 in association with FIGS. 18 and 19, refresh operations for the main memory cell rows MRA1 through MRAn may be performed during the refresh cycle tREF, and refresh operations for the ECC memory cell rows ECCRA1 through ECCRAi may be performed during a cycle corresponding to a half of the refresh cycle tREF. The refresh operation may be performed so that the normal memory cell rows MRA1 through MRAn/2 corresponding to a half of the main memory cell rows MRA1 through MRAn are sequentially refreshed, the ECC memory cell rows ECCRA1 through ECCRAi are sequentially refreshed, the main memory cell rows MRAn/2+1 through MRAn corresponding to the remaining half of the main memory cell rows MRA1 through MRAn are sequentially refreshed, and the ECC memory cell rows ECCRA1 through ECCRAi are sequentially refreshed.

Figure 21:
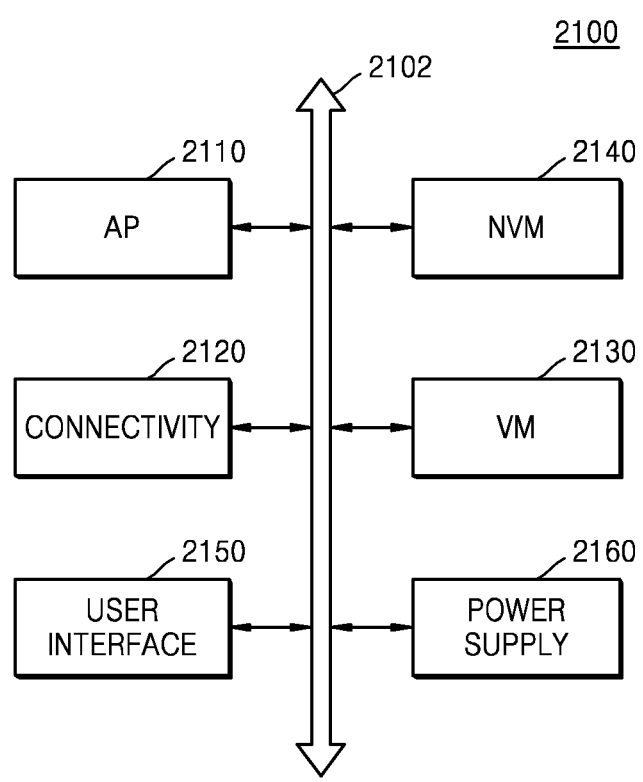
FIG. 21 is a block diagram illustrating an example where a semiconductor memory device for controlling a refresh operation of redundancy memory cells is applied to a mobile system, according to certain embodiment of the inventive concept.

FIG. 21 is a block diagram illustrating an example where a semiconductor memory device for controlling a refresh operation of redundancy memory cells is applied to a mobile system 2100, according to an embodiment of the inventive concept.

Referring to FIG. 21, the mobile system 2100 may include an application processor 2110, a connectivity unit 2120, a first memory device 2130, a second memory device 2140, a user interface 2150, and a power supply 2160. The first memory device 2130 may be set as a volatile memory device and the second memory device 2140 may be set as a nonvolatile memory device. According to embodiments, examples of the mobile system 2100 may include a mobile phone, a smart phone, a personal digital assistant (PDA), a portable multimedia player (PMP), a digital camera, a music player, a portable game console, or a navigation system.

The application processor 2110 may execute applications for providing an internet browser, a game, and a video. According to embodiments, the application processor 2110 may be a single-core or multi-core processor. For example, the application processor 2110 may be a dual-core, quad-core, or hexa-core processor. Also, according to embodiments, the application processor 2110 may further include a cache memory that is located inside or outside the application processor 2110.

The connectivity unit 2120 may perform a wireless communication or a wired communication with an external device. For example, the connectivity unit 2120 may perform an Ethernet communication, a near field communication (NFC), a radio frequency identification (RFID) communication, a mobile telecommunication, a memory card communication, or a universal serial bus (USB) communication. For example, the connectivity unit 2120 may include a baseband chipset, and may support a communication such as global system for mobile communication (GSM), general packet radio service (GRPS), wideband code-division multiple access (WCDMA), or HSxPA.

The first memory device 2130 that is a volatile memory device may store data that is processed by the application processor 2110, or may operate as a working memory. The first memory device 2130 may be a DRAM for controlling a refresh operation of redundancy memory cells in order to prevent the redundancy memory cells from being disturbed. The first memory device 2130 may generate a refresh row address so that normal memory cells of normal memory cell rows are refreshed during a first refresh cycle corresponding to the refresh cycle tREF, and redundancy memory cells of redundancy memory cell rows are refreshed during a second refresh cycle that is shorter than the first refresh cycle. The first memory device 2130 may generate the refresh row address so that normal memory cells of an edge memory cell row that is disposed adjacent to a redundancy memory cell row and among the normal memory cell rows is refreshed during the second refresh cycle.

According to embodiments, the first memory device 2130 may be a DRAM employing twin redundancy memory cells in order to improve refresh characteristics of the redundancy memory cells. The first memory device 2130 may generate a refresh row address so that normal memory cells of normal memory cell rows are refreshed during a first refresh cycle and redundancy memory cells of redundancy memory cell rows are refreshed during a second refresh cycle that is longer than the first refresh cycle.

According to embodiments, the first memory device 2130 may be a DRAM including an ECC memory cell block that generates parity bits by performing an ECC operation for controlling a defective cell from among memory cells in a main memory cell block and stores the parity bits. The first memory device 2130 may generate a refresh row address so that normal memory cells of main memory cell rows are refreshed during a first refresh cycle corresponding to the refresh cycle tREF, and ECC memory cells of ECC memory cell rows are refreshed during a second refresh cycle that is shorter than the first refresh cycle.

The second memory device 2140 that is a nonvolatile memory device may store a boot image for booting the mobile system 2100. For example, examples of the non-volatile memory device 2140 may include an electrically erasable programmable read-only memory (EEPROM), a flash memory, a PRAM, an RRAM, a nano floating gate memory (NFGM), a polymer random-access memory (PoRAM), an MRAM, a ferroelectric random-access memory (FRAM), and other similar memories.

The user interface 2150 may include at least one input device such as a keypad or a touch screen and/or at least one output device such as a speaker or a display device. An operating voltage may be supplied to the power supply 2160. Also, according to embodiments, the mobile system 2100 may further include a camera image processor (CIP), and may further include a storage device such as a memory card, a solid-state drive (SSD), a hard disk drive (HDD), or a CD-ROM.

Figure 22:
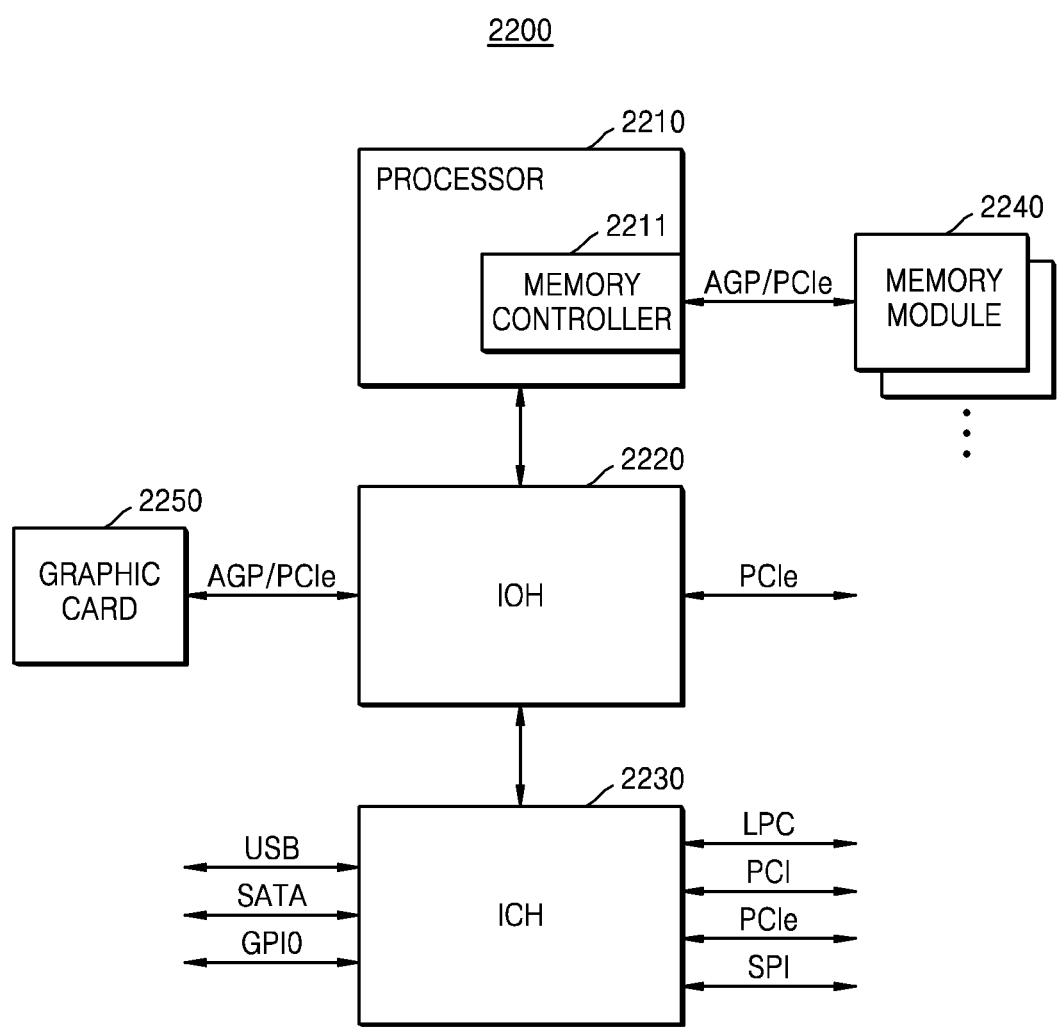
FIG. 22 is a block diagram illustrating an example where a semiconductor memory device for controlling a refresh operation of redundancy memory cells is applied to a computing system, according to certain embodiment of the inventive concept.

FIG. 22 is a block diagram illustrating an example where a semiconductor memory device for controlling a refresh operation of redundancy memory cells is applied to a computing system 2200, according to an embodiment of the inventive concept.

Referring to FIG. 22, the computing system 2200 includes a processor 2210, an input/output hub 2220, an input/output controller hub 2230, at least one memory module 2240, and a graphic card 2250. According to embodiments, examples of the computing system 2200 may include a personal computer (PC), a server computer, a workstation, a laptop, a mobile phone, a smart phone), a PDA, a PMP, a digital camera, a digital TV, a set-top box, a music player, a portable game console, and a navigation system.

The processor 2210 may perform various computing functions such as specific calculations or tasks. For example, the processor 2210 may be a microprocessor or a central processing unit (CPU). According to embodiments, the processor 2210 may be a single-core or multi-core processor. For example, the processor 2210 may be a dual-core, quad-core, or hexa-core processor. Also, although the computing system 2200 includes only one processor 2210 in FIG. 22, according to embodiments, the computing system 2200 may include a plurality of processors. Also, according to embodiments, the processor 2210 may further include a cache memory that is located inside or outside the processor 2210.

The processor 2210 may include a memory controller 2211 for controlling an operation of the memory module 2240. The memory controller 2211 that is included in the processor 2210 may be referred to as an integrated memory controller (IMC). The memory controller 2211 and the memory module 2240 may interface with each other through one channel including a plurality of signal lines or a plurality of channels. Also, one or more memory modules 2240 may be connected to each channel. According to embodiments, the memory controller 2211 may be disposed in the input/output hub 2220. The input/output hub 220 including the memory controller 2211 may be referred to as a memory controller hub (MCH).

The memory module 2240 may include a plurality of memory chips for storing data that is applied from the memory controller 2211. The memory chips may be DRAMs such as double data rate synchronous dynamic random-access memories (DDR SDRAMs), low power double data rate synchronous dynamic random-access memories (LPDDR SDRAMs), graphics double data rate synchronous dynamic random-access memories (GDDR SDRAMs), or Rambus dynamic random-access memories (RDRAMs).

The memory chips may be DRAMs for controlling a refresh operation of redundancy memory cells in order to prevent the redundancy memory cells from being disturbed. The memory chips may generate a refresh row address so that normal memory cell rows are refreshed during a first refresh cycle corresponding to the refresh cycle tREF and redundancy memory cell rows are refreshed during a second refresh cycle that is shorter than the first refresh cycle. The memory chips may generate a refresh row address so that an edge memory cell row that is adjacent to a redundancy memory cell row from among the normal memory cell rows is refreshed during the second refresh cycle.

According to embodiments, the memory chips may be DRAMs employing twin redundancy memory cells in order to improve refresh characteristics of the redundancy memory cells. The memory chips may generate a refresh row address so that normal memory cells of normal memory cell rows are refreshed during a first refresh cycle and redundancy memory cells of redundancy memory cell rows are refreshed during a second refresh cycle that is longer than the first refresh cycle.

According to embodiments, the memory chips may be DRAMs including an ECC memory cell block that generates parity bits by performing an ECC operation for controlling a defective cell from among memory cells in a main memory cell block and stores the parity bits. The memory chips may generate a refresh row address so that normal memory cells of main memory cell rows are refreshed during a first refresh cycle corresponding to the refresh cycle tREF and ECC memory cells of ECC memory cell rows are refreshed during a second refresh cycle that is shorter than the first refresh cycle.

The input/output hub 2220 may manage data transfer between the processor 2210 and devices such as the graphic card 2250. The input/output hub 2220 may be connected to the processor 2210 via any of various interfaces. For example, the input/output hub 2220 and the processor 2210 may be connected to each other via any of standard interfaces such as a front side bus (FSB), a system bus, a HyperTransport, a lightning data transport (LDT), a QuickPath interconnect (QPI), a common system interface, and a peripheral component interface-express (CSI). Although the computing system 2200 includes only one input/output hub 2220 in FIG. 22, according to embodiments, the computing system 2200 may include a plurality of the input/output hubs 2220.

The input/output hub 2220 may provide various interfaces with devices. For example, the input/output hub 2220 may provide an accelerated graphics port (AGP) interface, a peripheral component interconnect-express (PCIe) interface, or a communication streaming architecture (CSA) interface.

The graphic card 2250 may be connected to the input/output hub 2220 via an AGP interface or a PCIe interface. The graphic card 2250 may control a display device (not shown) for displaying an image. The graphic card 2250 may include an internal processor for processing image data and an internal semiconductor memory device. According to embodiments, the input/output hub 2220 may include a graphic device inside the input/output hub 2220 instead of the graphic card 2250 or along with the graphic card 2250 that is disposed outside the input/output hub 2220. The graphic device that is included in the input/output hub 2220 may be referred to as an integrated graphic device. Also, the input/output hub 2220 including the graphic device and the memory controller may be referred to as a graphics and memory controller hub (GMCH).

The input/output controller hub 2230 may perform data buffering and interface arbitration in order to efficiently operate various system interfaces. The input/output controller hub 2230 may be connected to the input/output hub 2220 via an internal bus. For example, the input/output hub 2220 and the input/output controller hub 2230 may be connected to each other via a direct media interface (DMI), a hub interface, an enterprise Southbridge interface (ESI), or an PCIe interface.

The input/output controller hub 2230 may provide various interfaces with peripheral devices. For example, the input/output controller hub 2230 may provide a USB port, a serial advanced technology attachment (SATA) port, a general purpose input/output (GPIO), a low pin count (LPC) bus, a serial peripheral interface (SPI), a peripheral component interconnect (PCI), or a PCIe.

According to embodiments, two or more elements from among the processor 2210, the input/output hub 2220, and the input/output controller hub 2230 may be realized as one chipset.

While the inventive concept has been particularly shown and described with reference to exemplary embodiments thereof, it will be understood that various changes in form and details may be made therein without departing from the spirit and scope of the following claims. Accordingly, such modifications are intended to be included within the scope of the present disclosure as defined in the claims.

What is claimed is:

1. A semiconductor memory device comprising:
a memory cell array including a plurality of memory cells arranged in rows and columns, wherein the rows are divided into a first set of rows and a second set of rows, and wherein one or more rows of the first set of rows are configured to be replaced with one or more rows of the second set of rows; and
a refresh address generator configured to generate first refresh addresses, second refresh addresses, and a third refresh address, wherein memory cells of the first set of rows including memory cells of an adjacent row adjacent to the second set of rows are periodically refreshed according to a first refresh cycle in response to the first refresh addresses, memory cells of the second set of rows are periodically refreshed according to a second refresh cycle in response to the second refresh addresses, and memory cells of the adjacent row are additionally periodically refreshed according to the second refresh cycle in response to the third refresh address,
wherein the first refresh cycle begins at a first time point and ends at a second time point and includes a first set of time periods between the first time point and the second time point, and the second refresh cycle begins at a third time point and ends at a fourth time point and includes a second time period between the third time point and the fourth time point,
wherein none of the first set of time periods overlap the second time period,
wherein the refresh address generator is configured to generate the first refresh addresses by a first counting operation and the second refresh addresses by a second counting operation,
wherein memory cells of the first set of rows are refreshed during the first set of time periods, and memory cells of the second set of rows are refreshed during the second time period, and
wherein as a result of the first and second refresh cycles, memory cells of the adjacent row of the first set of rows are refreshed both during one of the first set of time periods and during the second time period.

2. The semiconductor memory device of claim 1, wherein the length of time of the second refresh cycle is shorter than the length of time of the first refresh cycle.

3. The semiconductor memory device of claim 2, wherein each of memory cells of the first and second set of rows comprises a dynamic random-access memory (DRAM) cell including one transistor and one capacitor.

4. The semiconductor memory device of claim 1, wherein the length of time of the second refresh cycle is longer than the length of time of the first refresh cycle.

5. The semiconductor memory device of claim 4, wherein each of memory cells of the first set of rows comprises a dynamic random-access memory (DRAM) cell including one transistor and one capacitor,
wherein the second set of rows are redundancy memory cell rows, and
wherein each memory cell of a first redundancy memory cell row of the redundancy memory cell rows is connected as a twin DRAM cell including two transistors and two capacitors.

6. The semiconductor memory device of claim 1, wherein the refresh address generator comprises:
a first refresh address generator configured to generate a first counting signal as a first refresh address of the first refresh addresses for selecting one or more rows of the first set of rows;
a second refresh address generator configured to generate a second counting signal as a second refresh address of the second refresh addresses for selecting one or more rows of the second set of rows;
a refresh controller configured to receive at least one bit of the first counting signal as a refresh control signal, and to generate a selection signal in response to the refresh control signal and a most significant bit (MSB) of the second counting signal; and
an address selector configured to selectively output the first refresh address or the second refresh address in response to the selection signal.

7. The semiconductor memory device of claim 6, wherein the first refresh address generator is configured to generate a bit that is one bit lower than an MSB of the first counting signal as the refresh control signal.

8. The semiconductor memory device of claim 7, wherein the length of time of the second refresh cycle is half of the length of time of the first refresh cycle.

9. The semiconductor memory device of claim 6, wherein the first refresh address generator is configured to generate a bit that is two bits lower than an MSB of the first counting signal as the refresh control signal.

10. The semiconductor memory device of claim 9, wherein the length of time of the second refresh cycle is a quarter of the length of time of the first refresh cycle.

11. The semiconductor memory device of claim 1, wherein the refresh address generator comprises:
    a first refresh address generator configured to generate a first counting signal as a first refresh address of the first refresh addresses for selecting one or more rows of the first set of rows;
    a second refresh address generator configured to generate a second counting signal as a second refresh address of the second refresh addresses by performing a counting operation for selecting one or more rows of the second set of rows;
    an address storage circuit configured to store and output the third refresh address; and
    a refresh controller configured to receive at least one bit of the first counting signal as a refresh control signal, to generate a first selection signal in response to a refresh signal of the adjacent row and a most significant bit (MSB) of the second counting signal, and to generate a second selection signal in response to the refresh control signal and the refresh signal of the adjacent row; and
    an address selector configured to selectively output the first refresh address, the second refresh address, or the third refresh address in response to the first and second selection signals.

12. The semiconductor memory device of claim 11, wherein the first refresh address generator is configured to output a bit that is one bit lower than an MSB of the first counting signal as the refresh control signal.

13. The semiconductor memory device of claim 12, wherein the length of time of the second refresh cycle is half of the length of time of the first refresh cycle.

14. The semiconductor memory device of claim 11, wherein the first refresh address generator is configured to output a bit that is two bits lower than an MSB of the first counting signal as the refresh control signal.

15. The semiconductor memory device of claim 14, wherein the length of time of the second refresh cycle is a quarter of the length of time of the first refresh cycle.

16. A semiconductor memory device comprising:
    a first memory cell block including a first set of memory cells arranged in a first set of rows and a first set of columns;
    a second memory cell block including a second set of memory cells arranged in a second set of rows and a second set of columns, wherein the second set of memory cells are configured to store parity bits, and wherein a defective memory cell of the first set of rows is repaired by the parity bits; and
    a refresh address generator configured to generate a refresh address, wherein the first set of memory cells are periodically refreshed according to a first refresh cycle and the second set of memory cells are periodically refreshed according to a second refresh cycle,
    wherein the first refresh cycle begins at a first time point and ends at a second time point and includes a first set of time periods between the first time point and the second time point, and the second refresh cycle begins at a third time point and ends at a fourth time point and includes a second time period between the third time point and the fourth time point,
    wherein the length of time of the second refresh cycle is different from the length of time of the first refresh cycle, and none of the first set of time periods overlap the second time period, and
    wherein the first set of memory cells are once refreshed and the second set of memory cells are twice or more refreshed between the first time point and the second time point.

17. The semiconductor memory device of claim 16, further comprising:
    an error-correction code (ECC) circuit configured to:
    generate the parity bits, to be written in the second set of memory cells; and
    generate error-corrected data by detecting and correcting an error bit of the first set of memory cells by using data of the first set of memory cells and parity bits of the second set of memory cells.

18. The semiconductor memory device of claim 16, wherein the length of time of the second refresh cycle is shorter than the length of time of the first refresh cycle.

19. A semiconductor memory device comprising:
    a first memory cell block including a first set of memory cells arranged in a first set of rows;
    a second memory cell block including a second set of memory cells arranged in a second set of rows, wherein one or more rows of the first set of rows including a first defective memory cell are configured to be replaced with one or more rows of the second set of rows; and
    a third memory cell block including a third set of memory cells arranged in a third set of rows, wherein the third set of memory cells are configured to store parity bits, and wherein a defective memory cell of the first set of rows is repaired by the parity bits,
    wherein the semiconductor memory device is configured such that the first set of memory cells are periodically refreshed according to a first refresh cycle, the second set of memory cells are periodically refreshed according to a second refresh cycle, and the third set of memory cells are periodically refreshed according to a third refresh cycle,
    wherein the first refresh cycle begins at a first time point and ends at a second time point and includes a first set of time periods, the second refresh cycle begins at a third time point and ends at a fourth time point and includes a second time period, and the third refresh cycle begins at a fifth time point and ends at a sixth time point and includes a third time period,
    wherein the length of time of each of the second and third refresh cycles is different from the length of time of the first refresh cycle, and none of the first set of time periods overlap either the second time period or the third time period, and
    wherein the first set of memory cells are once refreshed and the second and third sets of memory cells are twice or more refreshed between the first time point and the second time point.

* * * * *